(12) United States Patent
Smith

(10) Patent No.: US 8,236,640 B2
(45) Date of Patent: Aug. 7, 2012

(54) METHOD OF FABRICATING A SEMICONDUCTOR DEVICE HAVING GATE FINGER ELEMENTS EXTENDED OVER A PLURALITY OF ISOLATION REGIONS FORMED IN THE SOURCE AND DRAIN REGIONS

(75) Inventor: Michael Andrew Smith, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 306 days.

(21) Appl. No.: 12/642,604

(22) Filed: Dec. 18, 2009

(65) Prior Publication Data
US 2011/0147844 A1 Jun. 23, 2011

(51) Int. Cl.
*H01L 21/336* (2006.01)

(52) U.S. Cl. .. 438/221; 438/296; 438/585; 257/E21.417

(58) Field of Classification Search .................. 438/218, 438/221, 294, 296, 585; 257/E21.417
See application file for complete search history.

(56) References Cited

U.S. PATENT DOCUMENTS

| | | | | |
|---|---|---|---|---|
| 5,473,180 A | * | 12/1995 | Ludikhuize | 257/336 |
| 5,777,366 A | * | 7/1998 | Contiero et al. | 257/355 |
| 5,886,384 A | * | 3/1999 | Soderbarg et al. | 257/347 |
| 7,242,040 B2 | | 7/2007 | Sankin et al. | |
| 7,560,346 B2 | | 7/2009 | Igarashi | |
| 2008/0217653 A1 | * | 9/2008 | Sonsky | 257/190 |
| 2008/0230812 A1 | * | 9/2008 | Disney et al. | 257/272 |
| 2008/0265363 A1 | * | 10/2008 | Gambino et al. | 257/510 |
| 2008/0296636 A1 | * | 12/2008 | Darwish et al. | 257/256 |
| 2008/0296679 A1 | * | 12/2008 | Blanchard | 257/342 |
| 2008/0296694 A1 | * | 12/2008 | Sonsky | 257/369 |
| 2009/0059111 A1 | * | 3/2009 | Jang | 349/46 |
| 2009/0256212 A1 | * | 10/2009 | Denison et al. | 257/408 |
| 2010/0090278 A1 | * | 4/2010 | Rohrer | 257/339 |
| 2010/0096697 A1 | * | 4/2010 | Su et al. | 257/343 |
| 2010/0314666 A1 | * | 12/2010 | Saito et al. | 257/201 |
| 2011/0140204 A1 | * | 6/2011 | Smith et al. | 257/408 |
| 2011/0198691 A1 | * | 8/2011 | Sonsky et al. | 257/337 |
| 2012/0037985 A1 | * | 2/2012 | Smith | 257/336 |

OTHER PUBLICATIONS

German Patent Application No. 102010532975 Office Action dated Aug. 31, 2011 corresponding to U.S. Appl. No. 12/642,604.

* cited by examiner

*Primary Examiner* — Anh Mai
(74) *Attorney, Agent, or Firm* — Blakely, Sokoloff, Taylor & Zafman LLP

(57) ABSTRACT

Embodiments of the present invention describe a semiconductor device implementing the reduced-surface-field (RESURF) effect. The semiconductor device comprises a source/drain region having a plurality of isolation regions interleaved with source/drain extension regions. A gate electrode is formed on the semiconductor device, where the gate electrode includes gate finger elements formed over the isolation regions to induce capacitive coupling. The gate finger elements enhance the depletion of the source/drain extension regions, thus inducing a higher breakdown voltage.

7 Claims, 22 Drawing Sheets

METHOD OF FABRICATING A SEMICONDUCTOR DEVICE HAVING GATE FINGER ELEMENTS EXTENDED OVER A PLURALITY OF ISOLATION REGIONS FORMED IN THE SOURCE AND DRAIN REGIONS

BACKGROUND

1. Field

One or more embodiments of the present invention relate to the field of semiconductor devices an more particularly to a transistor with enhanced reduced surface field (RESURF) effect.

2. Discussion of Related Art

Power semiconductor devices, such as high voltage transistors, are designed to support high voltage levels in various applications. In one instance, high voltage transistors are implemented in the peripheral circuitry of semiconductor memory devices such as Flash memory devices. There is constant desire to reduce the size of these memory devices, including the memory cells and the peripheral devices to improve performance. However, downscaling of high voltage transistors is limited by several factors. For example, to maintain a high drain-source breakdown voltage (BVdss), the contact to gate spacing must remain relatively large. Furthermore, the transistor must supply the drive current demanded by circuit operation, which translates to a large on-resistance (Ron), thus resulting in a wide device.

One method of reducing the size of the transistor is by increasing the BVdss-Ron ratio. A technique known as reduced-surface-field (RESURF) effect has been used to design transistors with high BVdss and low Ron. FIG. 1A illustrates a top plan view of a high voltage transistor known in the art that implements the dielectric RESURF concept. The high voltage transistor 10 comprises a substrate 20 having a source region 31 and a drain region 32. A plurality of shallow trench isolation (STI) regions 40 interleave the drain extensions 33 of the drain region 32 to induce a doping dilution in the drain extensions 33. A poly gate 50 is formed between the source and drain regions 31, 32, where the poly gate 50 comprises multiple poly gate fingers 51 formed on top of the STI regions 40. FIG. 1B shows the cross-sectional view of the poly gate fingers 51 formed on the STI regions 40. The poly gate fingers 51 induce a capacitive coupling with the STI regions 40, which enhances the depletion of the drain extensions 33. As a result, the electrical field is more evenly distributed over the drain extensions 33, thus inducing a higher breakdown voltage (BVdss).

The high voltage transistor 10 shown in FIGS. 1A and 1B is formed by a single poly gate 50. However, there are difficulties in integrating the high voltage transistor 10 in a typical Flash (NAND) memory fabrication process that forms a double poly layer gate stack, where the lower poly gate is self-aligned to the active area. Hence, there is need for an improved method of fabricating a transistor with the dielectric RESURF effect.

BRIEF DESCRIPTION OF THE DRAWINGS

FIGS. 4A-12A are top plan views that illustrate a method of fabricating the semiconductor device shown in FIG. 2 in accordance with one embodiment of the present invention.

FIGS. 4B-12B and 4C-12C are cross-sectional views of the semiconductor device shown in FIGS. 4A-12A.

FIGS. 15A-18A are top plan views that illustrate a method of fabricating the semiconductor device shown in FIG. 3 in accordance with one embodiment of the present invention.

FIGS. 15B-18B and 15C-18C are cross-sectional views of the semiconductor device shown in FIGS. 15A-18A.

FIGS. 19A-20A are top plan views illustrating an alternative embodiment of the semiconductor device shown in FIGS. 17A-18A.

FIG. 19B-20B are cross-sectional views of the semiconductor device shown in FIGS. 19A-20A.

DETAILED DESCRIPTION

A semiconductor device with reduced surface effect (RESURF) and its method of fabrication are described. In the following description, numerous specific details are set forth in order to provide a thorough understanding of the present invention. In other instances, well known semiconductor processing techniques and features have not been described in particular detail in order to not unnecessarily obscure the present invention.

In particular, embodiments of the present invention describe a semiconductor device utilizing the RESURF effect to optimize the breakdown voltage (BVdss). In an embodiment of the present invention, the semiconductor device comprises a source/drain region haying a plurality of isolation regions interleaved with source/drain extension regions. Agate electrode is formed on the semiconductor device, the gate electrode having gate finger elements formed over the isolation regions. The gate finger elements induce capacitive coupling with the isolation regions, thus enhancing the depletion of the source/drain extension regions. Hence, the electrical field is more evenly distributed over the source/drain extension regions, thus inducing a higher breakdown voltage (BVdss).

Figure 1A:
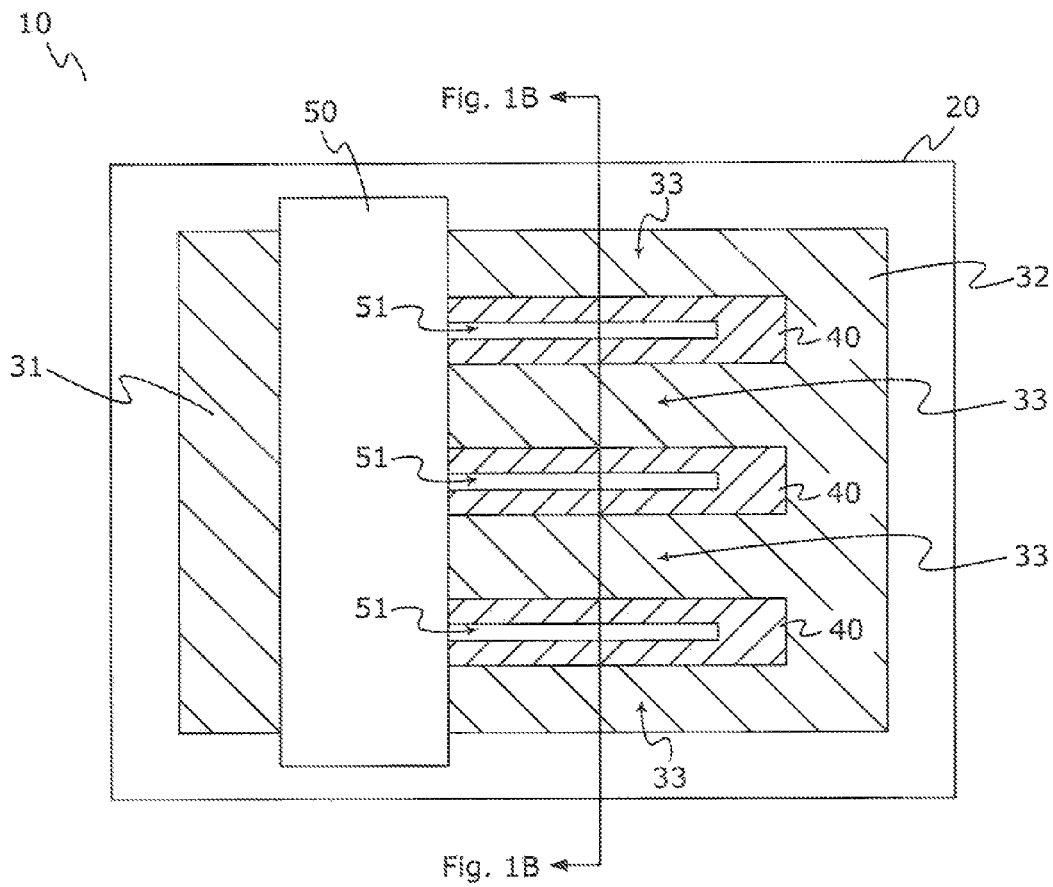
FIG. 1A is a top plan view that illustrates a high voltage transistor known in the art.
Figure 1B:
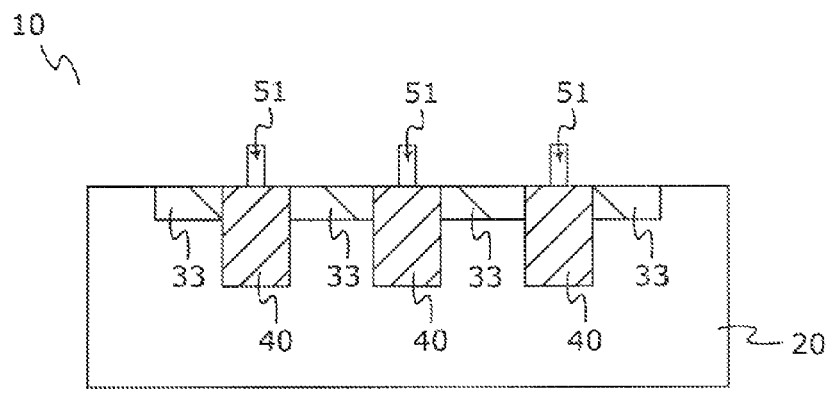
FIG. 1B is a cross-sectional view of the high voltage transistor shown in FIG. 1.
Figure 2:
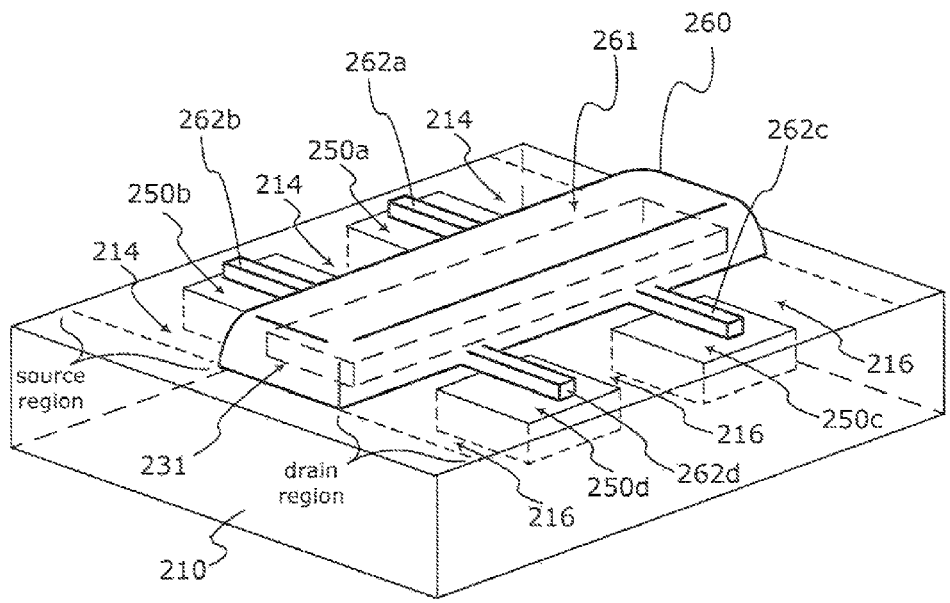
FIG. 2 is a perspective view that illustrates a semiconductor device in accordance with one embodiment, on of the present invention.

FIG. 2 is a perspective view of a semiconductor device in accordance with one embodiment of the present invention. In one embodiment, the semiconductor device is a field-effect transistor (FET) capable of operating at high voltage levels. The semiconductor device comprises a substrate 210 made of a semiconductor material, such as but not limited to silicon (Si), silicon germanium (Site), germanium (Ge), or III-V compound semiconductors. In one embodiment, the substrate 210 is the topmost silicon film of a silicon-on-insulator (SOI) substrate. In other embodiments, the substrate 210 is a multilayered substrate comprising silicon, silicon germanium, germanium, III-V compound semiconductors, or any combinations thereof.

The semiconductor device comprise a source region having a plurality of isolation regions 250a, 250b interleaved with portions of the substrate 210 referred herein as the source extension regions 214. Similarly, the drain region includes a plurality of isolation regions 250c, 250d interleaved with portions of the substrate 210 referred herein as the drain extension regions 216. In one embodiment, the isolation regions 250a, 250b, 250c, 250d are made from any well known insulative material, such as but not limited to silicon Oxide (e.g., $SiO_2$). The isolation regions 250a, 250b interleave the source extension regions 214 to induce a doping dilution in the source extension regions 214. Similarly, the isolation regions 250e, 250d interleave the drain extension regions 216 to induce a doping dilution in the drain extension regions 216.

A gate electrode is formed between the source and drain regions. The gate electrode comprises a first region 231 and a second region 260. In one embodiment, the first region 231 (represented by dashed lines) is a poly layer made from materials such as but not limited to polysilicon or polycide. In one embodiment, the first region 231 has a thickness of about 500 to 800 Angstroms. In one embodiment, the second region 260 is a poly layer made from similar Materials as the first region 231. In one embodiment, the first and second regions 231, 260 of the gate electrode can be doped with a n-type dopant, such as but not limited to phosphorus, to a sheet resistance of around 4 Ohms/square.

In an embodiment of the present invention, the second region 260 comprises a center portion 261 formed over the first region 231. In one embodiment, the second region 260 comprises a plurality of gate finger elements 262a, 262b, 262c, 262d formed over the isolation regions 250a, 250b, 250c, 250d. By forming the gate finger elements 262a, 262b on the isolation regions 250a, 250b, it improves the depletion of the source extension regions 214. Similarly, the gate finger elements 262c, 262d formed on the isolation regions 250c, 250d improves the depletion of the drain extension regions 216. As a result, the electrical field is more evenly distributed over the source and drain extension regions 214, 216 during operation of the device, resulting in a higher breakdown voltage.

FIG. 2 illustrate the implementation of the RESURF concept in both the source and drain regions by forming gate finger elements 262a, 262b, 262c, 262d on the isolation regions 250a, 250b, 250c, 250d. In an alternative embodiment, the RESURF effect can be achieved by only forming gate finger elements 262c, 262d on the isolation regions 250c, 250d of the drain region. In other words, the source region does not include the gate finger elements 262a, 262b and the isolation regions 250a, 250b.

Figure 3:
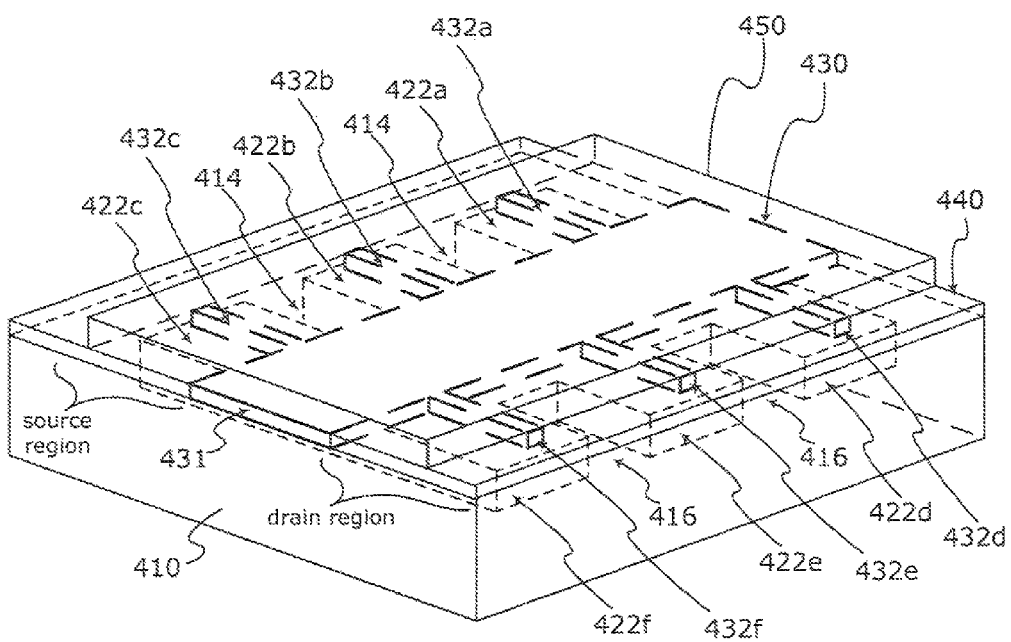
FIG. 3 is a perspective view that illustrates a semiconductor device in accordance with, another embodiment on of the present invention.

FIG. 3 is a perspective view of a semiconductor device implementing the RESURF concept in accordance with an alternative embodiment of the present invention. The semiconductor device comprises a substrate 410 made of similar materials as the substrate 210 described in FIG. 2.

The semiconductor device also comprises a source region having a plurality of isolation regions 422a, 422b, 422c interleaved with the source extension regions 414. Similarly, the drain region includes a plurality of isolation regions 422d, 422e, 422f interleaved with the drain extension regions 416. The isolation regions 422a, 422b, 422c, 422d, 422e, 422f are made from any well known insulative material, such as but not limited to silicon oxide (e.g., $SiO_2$). The isolation regions 422a, 422b, 422c interleave the source extension regions 414 to induce a doping dilution in the source extension regions 414. Similarly, the isolation regions 422d, 422e, 422f interleave the drain extension regions 416 to induce a doping dilution in the drain extension regions 416.

A gate electrode is formed between the source and drain regions. The gate electrode comprises a first region 430 and a second region 450. In one embodiment, the first region 430 (represented by dashed lines) and the second region 450 are made from materials such as but not limited to polysilicon or polycide. In an embodiment of the present invention, the first region 430 comprises a center portion 431, and a plurality of gate finger elements 432a, 432b, 432c, 432d, 432e, 432f extending from the center portion 431. The second region 450 is formed over the first region 430 so that it covers the entire center portion 431 and the plurality of gate finger elements 432a, 432b, 432c, 432d, 432e, 432f.

The gate finger elements 432a, 432b, 432c formed on the isolation regions 422a, 422b, 422c, improves the depletion of the source extension regions 414. Similarly, the gate finger elements 432d, 432e, 432f formed on the isolation regions 422d, 422e, 422f improve the depletion of the drain extension regions 416. As a result, the electrical field is more evenly distributed over the source and drain extension regions 414, 416 during operation of the device, resulting in a higher breakdown voltage.

FIG. 3 illustrate the implementation of the RESURF concept in both the source and drain regions by forming gate finger elements 432a, 432b, 432c, 432d, 432e, 432f on the isolation regions 422a, 422b, 422c, 422d, 422e, 422f. In an alternative embodiment, the RESURF effect can be achieved by only forming gate finger elements 432d, 432e, 432f on the isolation regions 422d, 422e, 422f of the drain region. In other words, the source region does not include the gate finger elements 432a, 432b, 432c nor the isolation regions 422a, 422b, 422c.

FIGS. 4A-12A are top plan views that illustrate a method of forming the semiconductor device shown in FIG. 2. FIGS. 4B-12B and 4C-12C are various cross-sectional views of the semiconductor device shown in FIGS. 4A-12A. The fabrication of the semiconductor device begins by providing the substrate 210 as shown by the cross-sectional views in FIGS. 4B and 4C. Then, a dielectric layer 220 is formed on the substrate 210. In one embodiment, the dielectric layer 220 is formed by using a thermal oxidation method or a local oxidation of silicon (LOCOS) process. In another embodiment, the dielectric layer 220 is blanket deposited on the substrate 210 by any well known methods, such as but not limited to physical vapor deposition (PVD), chemical vapor deposition (CVD) or atomic layer deposition (ALD). In one embodiment, the dielectric layer 220 is made from any well known insulative material for insulating the substrate 210 from the gate electrode. For example, the dielectric layer 220 is made of silicon oxide (e.g., $SiO_2$). In another embodiment, the dielectric layer 300 is made of a high-k dielectric material having a substantially higher dielectric constant than silicon dioxide (i.e. k>3.9). For example, the high-k dielectric material comprises metal oxide dielectric, such as but not limited to tantalum oxide ($Ta_2O_5$), titanium oxide ($TiO_2$) and hafnium oxide ($HfO_2$). In one embodiment, the dielectric layer 220 is formed with a thickness of around 350 Angstroms.

Next, a first poly layer 230 is deposited Over the dielectric layer 220. The first poly layer 230 is blanket deposited on the dielectric layer 220 by any well known methods, such as but not limited to physical vapor deposition (PVD) or chemical vapor deposition (CVD). In the case of a FLASH memory fabrication process, the first poly layer 230 can be used to form the floating gate of adjacent memory cell transistors (not shown) on the same substrate. In one embodiment, the first poly layer 230 is deposited with a thickness of around 500-850 Angstroms. In one embodiment, the first, poly layer 230 can be doped With a n-type dopant, such as but not limited to phosphorus, to a sheet resistance of around 4 Ohms/square. Doping of the first poly layer 230 can be performed during deposition or by a subsequent implantation process.

Next, a plurality of isolation regions is formed in the source region or drain region of the substrate 210. In an embodiment of the present invention, the fabrication of the plurality of isolation regions is similar to the common process of forming shallow trench isolation (STI) regions. In one embodiment, fabrication of the plurality of isolation regions begins by forming a plurality of trenches in the source region or drain region of the substrate 210.

Figure 4A:
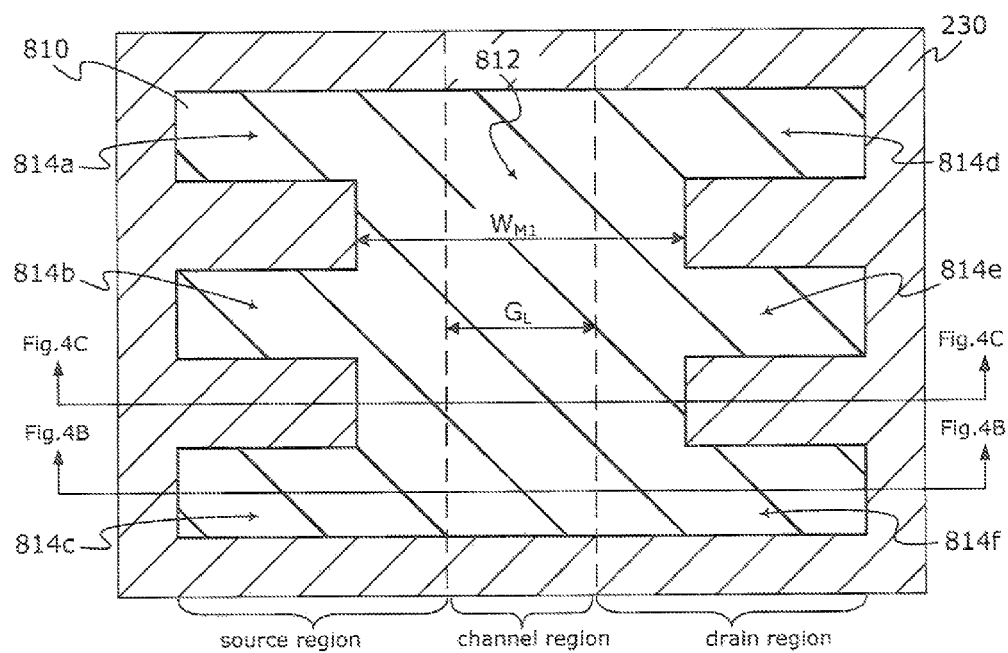
Figure 4B:
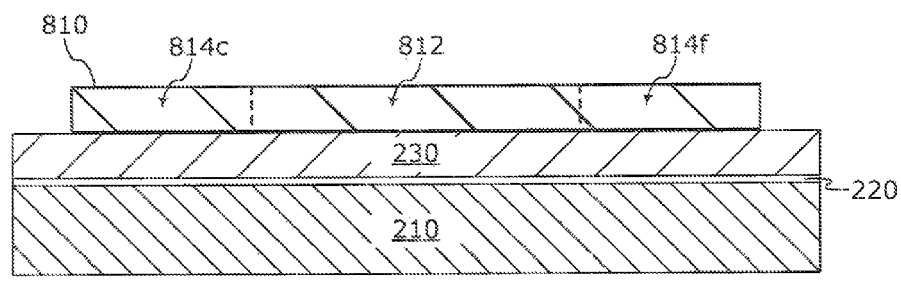
Figure 4C:
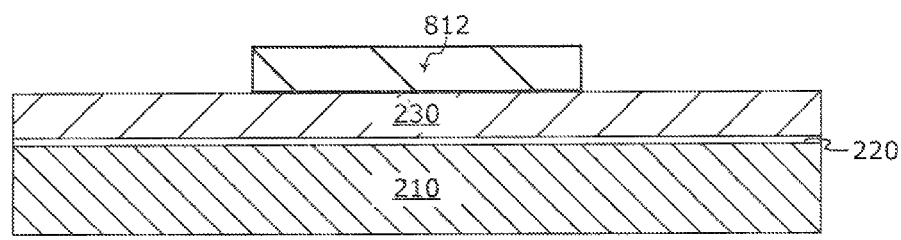

In one embodiment, the plurality of trenches are fabricated by first depositing a mask 810 on the first poly layer 230 as shown in FIGS. 4A-4C. The mask 810 is formed by well known photolithography techniques and will not be discussed in detail here. In one embodiment, the mask 810 is made of nitride materials such as but not to silicon nitride.

In one embodiment, the mask 810, as shown in FIG. 4A, comprises a center portion 812 formed over a desired channel region. In a specific embodiment, the width $W_{M1}$ of the center portion 812 is larger than the desired gate length $G_L$ of the semiconductor device. The mask 810 further comprises a plurality of mask finger elements 814a, 814b, 814c, 814d, 814e, 814f extending outwardly from opposite sides of the center portion 812. In one embodiment, the mask finger elements 814a, 814b, 814c are formed over the source region, and the mask finger elements 814d, 814e, 814f are formed over the drain region. The source region, drain region and channel region defines the active region of the semiconductor device. Adjacent mask finger elements 814a, 814b, 814c formed over the source region are spaced apart from each other so as to define portions of the first poly layer 230 and substrate 210 that are to be subsequently etched away. Similarly, adjacent mask finger elements 814d, 814e, 814f formed over the drain region are spaced apart from each other to define portions of the first poly layer 230 and substrate 210 that are to be Subsequently etched away.

Figure 5A:
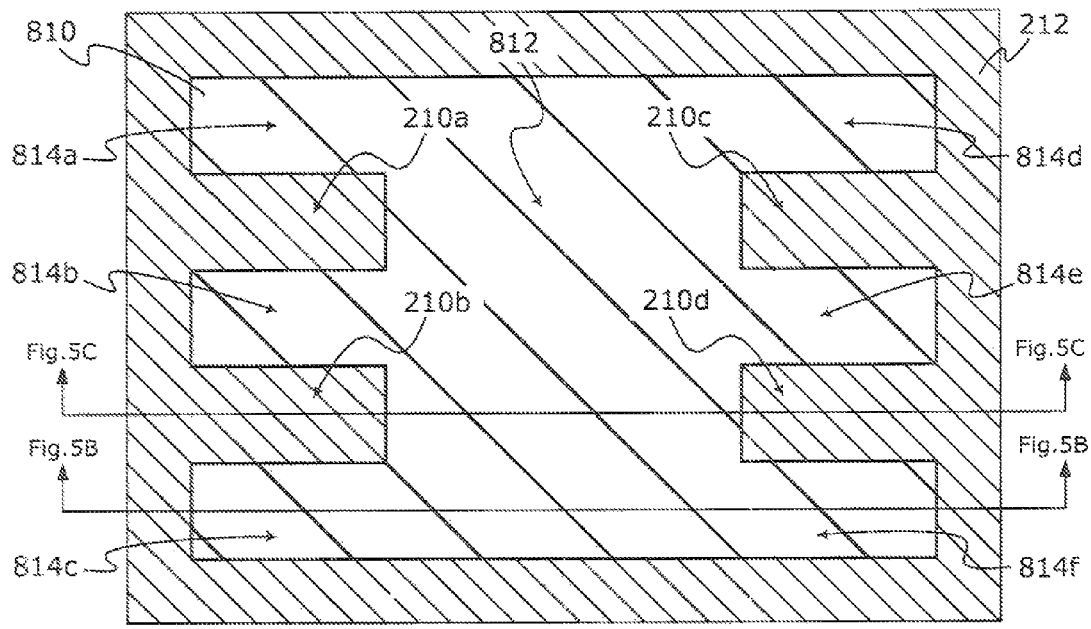
Figure 5B:
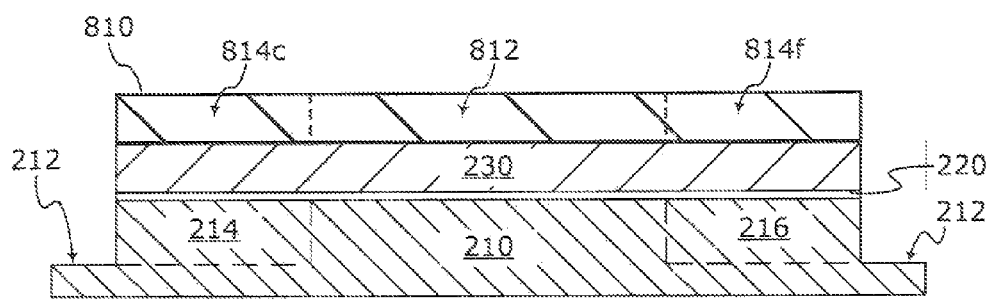
Figure 5C:
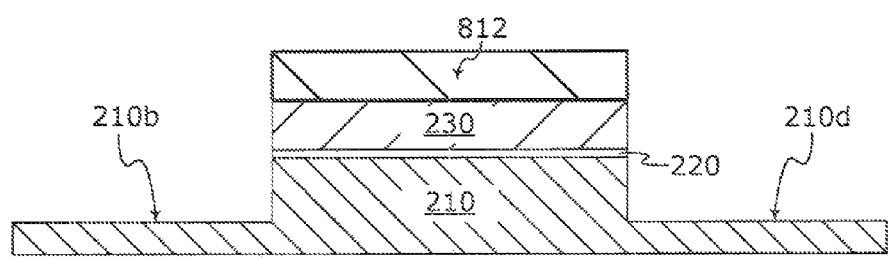

Next, in FIGS. 5A-5C, an etching is performed to remove portions of the substrate 210 which are not covered by the mask 810 to form a plurality of trenches 210a, 210b, 210c, 210d the substrate 210. In other words, the etching is performed in alignment with the mask 810 to define the trenches 210a, 210b, 210c, 210d. FIG. 5C is a cross-sectional view illustrating the trenches 220b and 220d. In an embodiment of the present invention, the etching also recessed portions 212 of the substrate 210 surrounding the active region of the semiconductor device as illustrated in FIGS. 5A and 5B.

The etching also defines the source extension regions 214, which refer to the portions of the substrate 210 directly beneath the mask finger elements 814a, 814b, 814c. In other words, the source extension regions 214 refer to the portions of the substrate 210 between the recessed portion 212 and trench 210a, between the trenches 210a, 210b, and between the trench 210b and recessed portion 212. FIG. 5B shows one of the source extension regions 214 that is formed between the trench 210b and recessed portion 212. Similarly, the etching defines drain extension regions 216, which refers to the portions of the substrate 210 directly beneath the mask finger elements 814d, 814e, 814f. FIG. 5O shows one of the drain extension regions 216 that is formed between the trench 210d and recessed portion 212.

The etching uses well known dry etch, wet etch or a combination of dry and wet etch techniques. In one embodiment a single etching step is performed in alignment with the mask 810 to remove portions of the first poly layer 230, the dielectric layer 220 and the substrate 210 at the same time. In another embodiment, multiple etching steps are performed in alignment with the mask 810 to remove portions of the first poly layer 230 before removing portions of the dielectric layer 220 and the substrate 210. In one embodiment, the trenches 210a, 210b, 210c, 210d are formed to a depth of about 2000-5000 Angstroms.

Figure 6A:
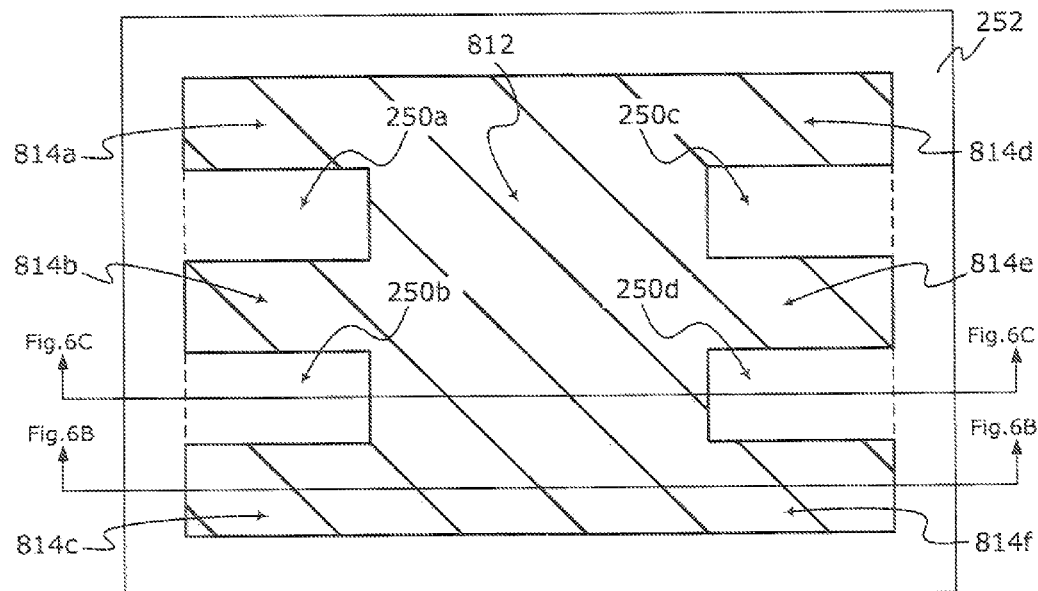
Figure 6B:
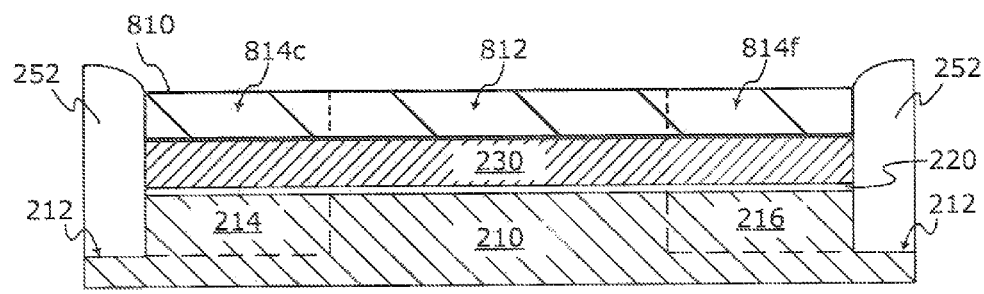
Figure 6C:
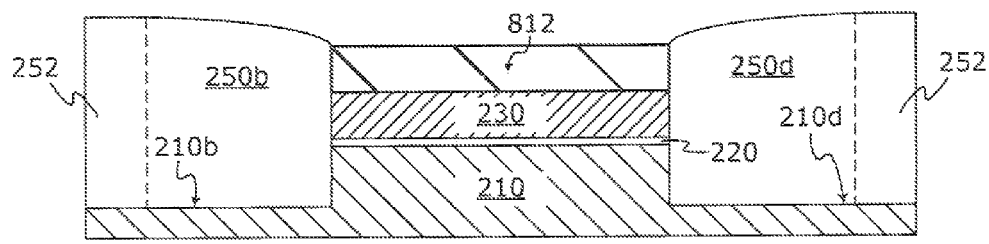

Next, an oxide layer is deposited onto each of the trenches 210a, 210b, 210c, 210d so as to form the isolation regions 250a, 250b, 250c, 250d as shown in FIGS. 6A-6C. The oxide layer is deposited onto the trenches 210a, 210b, 210c, 210d using well known methods, such as but not limited to physical vapor deposition (PVD), chemical vapor deposition (CVD) or atomic layer deposition (ALD).

At the source region, the isolation region 250a is formed onto the trench 210a, and the isolation region 250b is formed onto trench 210b, where both isolation regions 250a, 250b interleave the source extension regions 214. At the drain region, the isolation region 250c is formed onto the trench 210c, and the isolation region 250d is formed onto trench 210d, where both isolation regions 250c, 250d interleave the drain extension regions. FIG. 6C shows the isolation regions 250b, 250d formed over, the trenches 210b, 210d.

In one embodiment, portions 252 of the oxide layer are also formed over the recessed portions 212 of the substrate 210 as illustrated in FIGS. 6A and 6B. In one embodiment, these portions 252 of oxide layers function as shallow trench isolation (STI) regions to isolate the semiconductor device from adjacent devices or transistors.

Figure 7A:
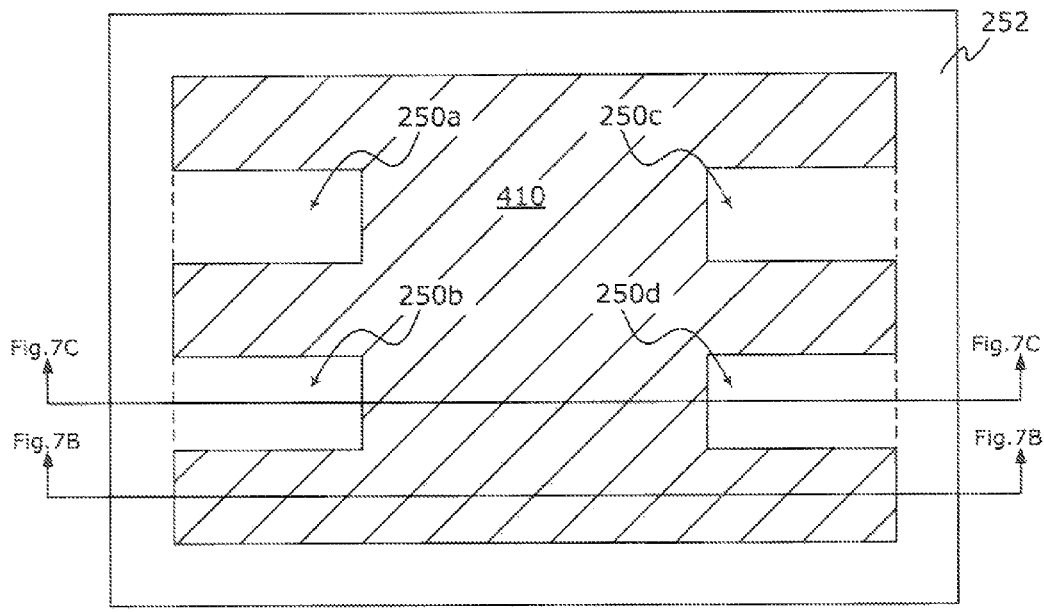
Figure 7B:
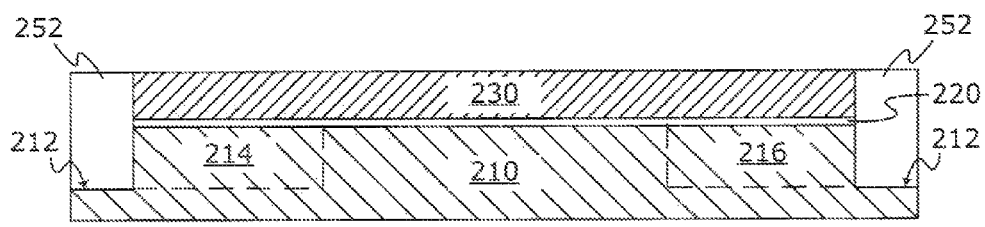
Figure 7C:

In an embodiment. Of the present invention, the top surfaces of the isolation regions 250a, 250b, 250c, 250d are planarized or polished so that they are substantially coplanar with the top surface of the first poly layer 230. In one embodiment, the first mask 810 is removed from the first poly layer 230 before planarization/polishing is performed on the isolation regions 250a, 250b, 250c, 250d until their top surfaces are substantially coplanar with the top surface of the first poly layer 230 as shown in FIG. 7C. Furthermore, the top surfaces of the portions 252 of oxide layer over the recessed portions 212 of the substrate 210 are also substantially coplanar with the top surface of the first poly layer 230 as shown in FIGS. 78 and 7C. The planarization or polishing can be performed by using well known techniques, such as but not limited to chemical mechanical planarization/polishing (CMP).

It can be appreciated that multiple planarization steps can be utilized to planarized/polished the top surface of the isolation regions 250a, 250b, 250c, 250d. For example, beginning from FIGS. 6A-6C, the top surface of the isolation regions 250a, 250b, 250c, 250d are polished until it is substantially coplanar to the top surface of the first mask 810. After removing the first mask 810 from the first poly layer 230, an additional polishing step is performed on isolation regions 250a, 250b, 250c, 250d until their top surfaces are substantially coplanar with the top surface of the first poly layer 230 as shown in FIGS. 7B and 7C.

Figure 8A:
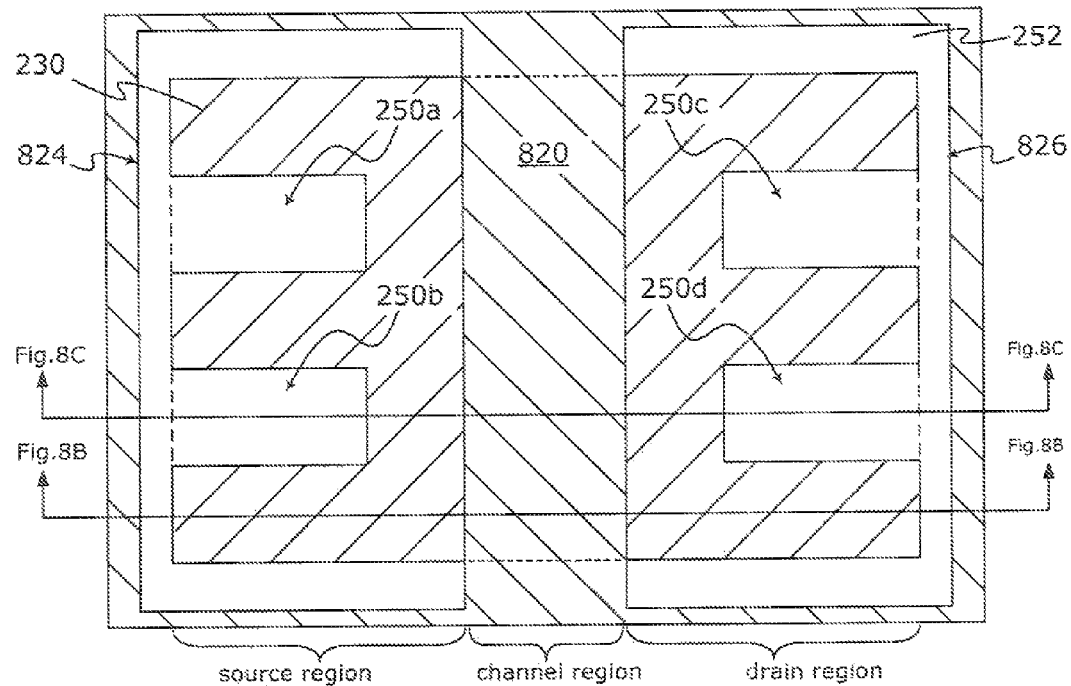
Figure 8B:
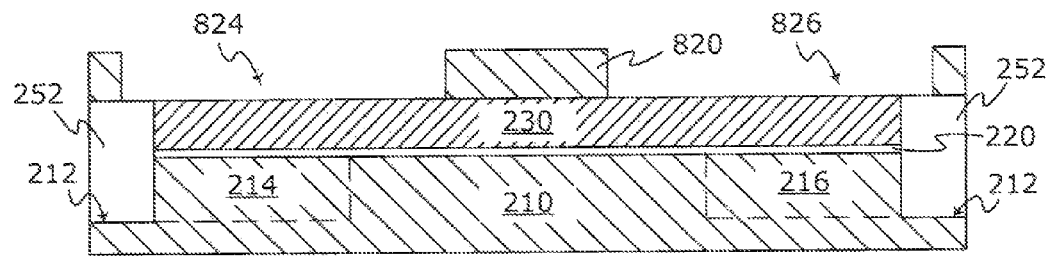
Figure 8C:
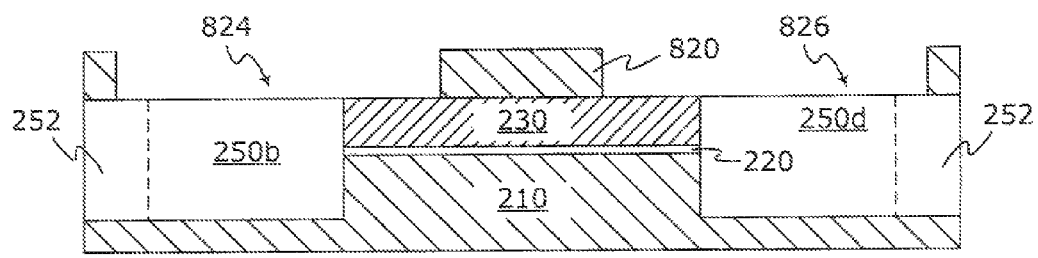

Next, the first poly layer 230 is etched to form a patterned first poly layer (i.e. the first region 231 of the gate electrode) over the channel region of the substrate 210. In an embodiment of the present invention, etching of the first poly layer 230 begins by forming a mask 820 over the first poly layer 230 as shown in FIGS. 8A-8C. In one embodiment, the mask 820 comprises an opening 824 exposing the source region, and another opening 826 exposing the drain region. The mask 820 is formed by well known photolithography techniques and will not be discussed in detail here.

Figure 9A:
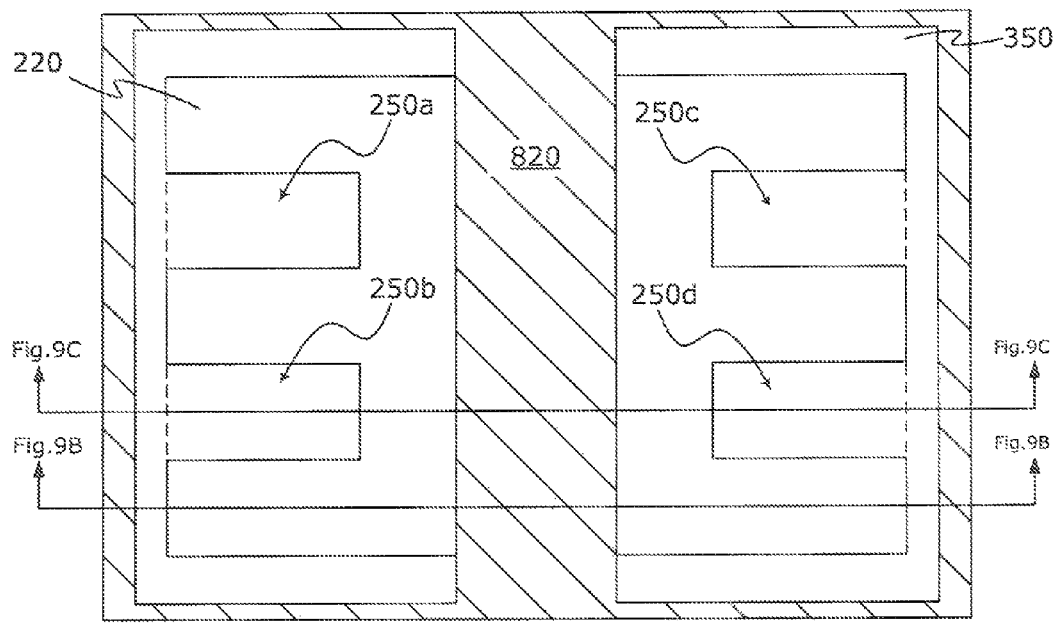
Figure 9B:
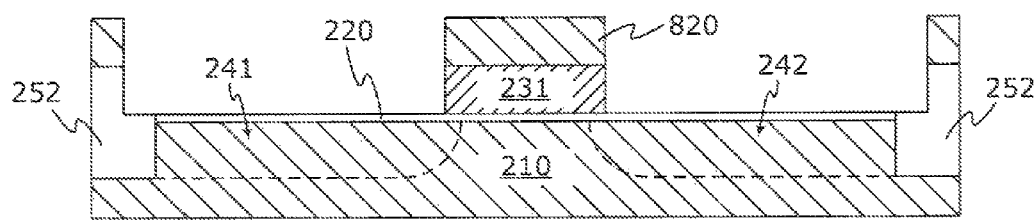
Figure 9C:
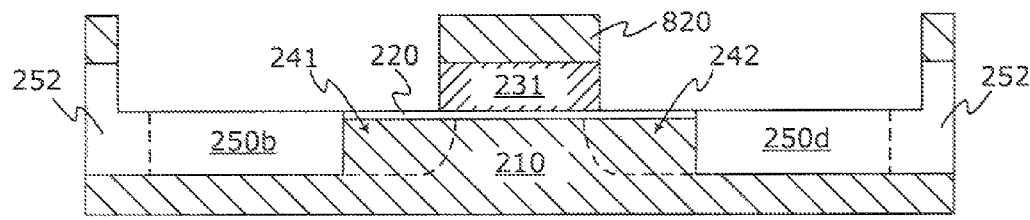

Next, etching is performed in alignment with the mask 820 to define, the patterned first poly layer over the channel region of the semiconductor device. In other words, portions of the first poly layer 230 that are not covered by the mask 820 are etched away to form the patterned first poly layer 231 as shown in FIGS. 9B and 9C. In this case, the patterned first poly layer 231 refers to the first region 231 as shown in FIG. 2. The etching of the first poly layer 230 utilizes well known dry etch, wet etch or a combination of dry and wet etch techniques. In one embodiment, the etching uses an etch chemistry that is substantially selective to the dielectric layer 220. In other words, the etch chemistry removes portions of the first poly layer 230 faster than it remove the dielectric layer 220.

In one embodiment, the etching can be controlled so that it does not etch the dielectric layer 220 as shown in FIGS. 9B and 9C. For example, the etching duration is adjusted so that the etching stops at the dielectric layer 220. In one embodiment, the dielectric layer 220 can be used as an etch-stop layer in the subsequent interpoly dielectric (IPD) etch. In another embodiment, the etching is controlled so that a thin film of the first poly layer 230 remains on the dielectric layer 220, and the thin film of first poly layer 230 has sufficient thickness to serve as an etch-stop, layer for the subsequent IPD etch but does not significantly affect the subsequent lightly-doped drain (LDD) implantation.

In an embodiment of the present invention, the etching of the first poly layer 230 also removes portions of the plurality of isolation regions 250a, 250b, 250c, 250d. In one embodiment, the etching duration is controlled so that the top surface of each of the plurality of isolation regions 250a, 250b, 250c, 250d is substantially coplanar to the top surface of the dielectric layer 220. FIG. 9C illustrates the isolation regions 250b, 250d having a top surface that is substantially coplanar to the top surface of the dielectric layer 220. In another embodiment, etching is performed until the top surface of each of the plurality of isolation regions 250a, 250b, 250c, 250d is substantially coplanar to the top surface of the substrate 210.

In one embodiment, etching of the first poly layer 230 and the plurality of isolation regions 250a, 250b, 250c, 250d is performed in a single etch. For example, the first poly layer 230 and the plurality of isolation regions 250a, 250b, 250c, 250d are etched simultaneously if there is low selectivity between the first poly layer 230 and the plurality of isolation regions 250a, 250b, 250c, 250d. In another embodiment, multiple etching steps can be utilized to etch the plurality of isolation regions 250a, 250b, 250c, 250d before or after etching the first poly layer 230.

After etching is completed, a LDD implantation is performed on the substrate 210, including the source and drain extension regions 214, 216, to form LDD regions in the source and drain regions of the substrate 210. In one embodiment, the LDD implantation is performed using the same mask 820 to form the LDD source 241 and LDD drain 242 in the source and drain regions as shown in FIGS. 9B and 9C. The source and drain extension regions 214, 216 shown in FIG. 8B are doped to form the LDD source 241 and LDD drain 242 as shown in FIG. 9B. The LDD implantation uses common techniques such as ion implantation to implant desired concentrations of boron, phosphorus or arsenic into the substrate 210. Once the LDD implantation is completed, the mask 820 is removed from the substrate 210.

Figure 10A:
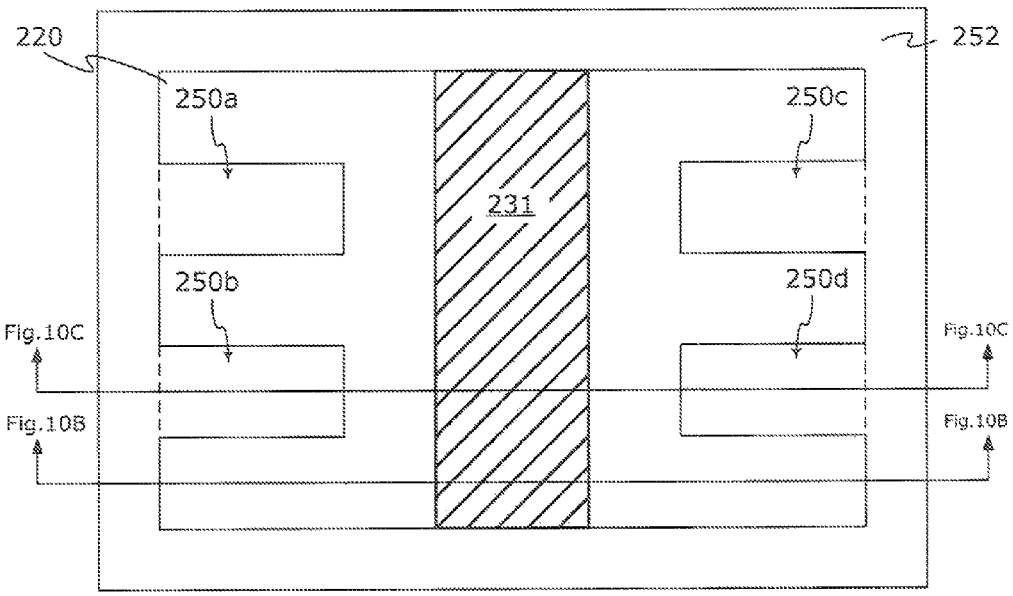
Figure 10B:
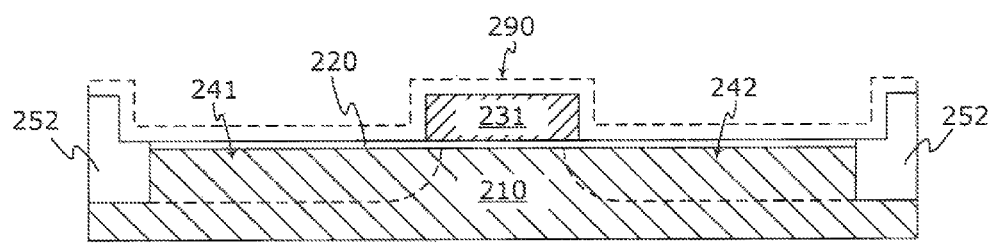
Figure 10C:
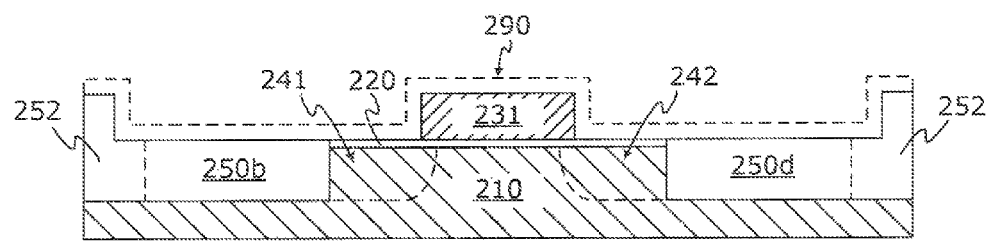

In an embodiment of the present invention, the semiconductor device is fabricated using a flash memory device fabrication process. Typically, in a typical flash memory device fabrication process, an interpoly dielectric (IPD) layer would Abe deposited between a lower poly layer and an upper poly layer. The lower poly layer and upper poly layer function as the floating gate and control gate of the flash memory device while the IPD layer serves as an inter-gate-dielectric (IGD). Common materials used for the IPD layer include oxynitride (ONO). The IPD layer is a critical feature for forming flash memory devices, for example NAND Flash cells, but it is not necessary for peripheral devices, such as high-voltage transistors. In the case where the semiconductor device is fabricated using the flash memory device fabrication process, an IPD layer 290 is blanket deposited over the entire substrate 210 as shown in FIGS. 10B and 10C, and then subsequently etched away. In particular, the IPD layer 290 is completely removed from the patterned first poly layer 231 so that the semiconductor device functions as a transistor and not as a memory cell. The IPD layer 290 is represented in dashed lines shown in FIGS. 10B and 10C to show that it has been removed from the substrate 210.

Figure 11A:
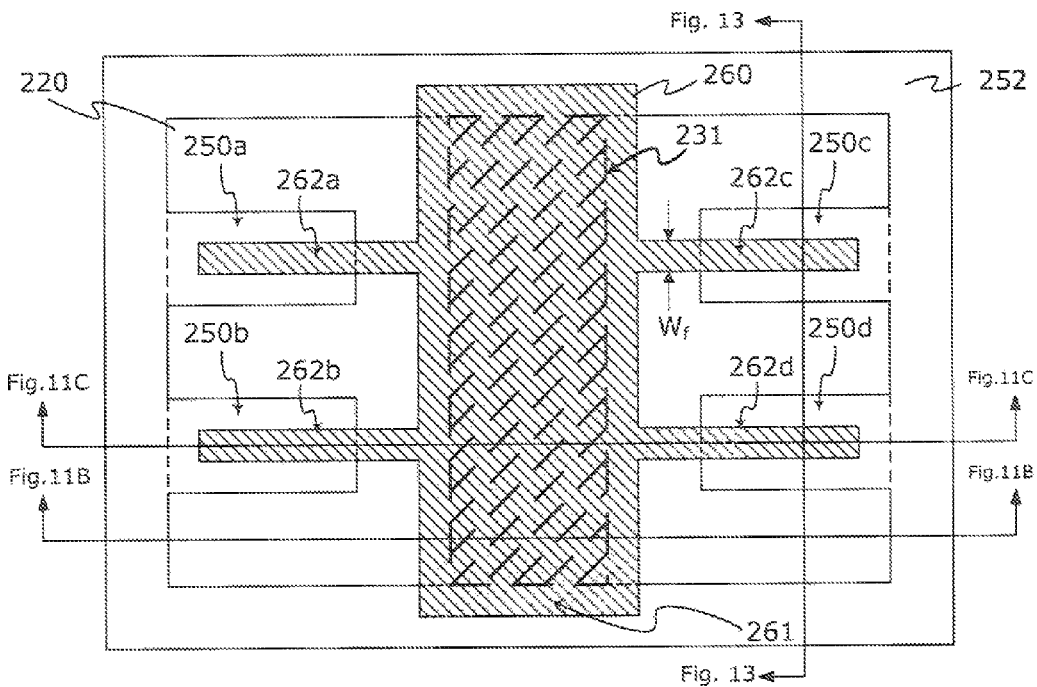

Next, a second poly layer 260 is formed over the patterned first poly layer, the second poly layer 260 having gate finger elements 262a, 262b, 262c, 262d extended over the plurality of isolation regions 250a, 250b, 250c, 250d as shown in FIG. 11A. In an embodiment of the present invention, fabrication of the second poly layer 260 begins by depositing a poly film (not shown) directly on the patterned first poly layer 231. In one embodiment, the poly film is deposited conformally on the patterned first poly layer 231. Then, the poly film is patterned using well known photolithography and etching techniques to define the second poly layer 260 having a center portion 261 formed directly on the patterned first poly layer 231, and, the gate finger elements 262a, 262b, 262c, 262d formed directly on the isolation regions 250a, 250b, 250c, 250d. In one embodiment, the second poly layer 260 can be doped with a n-type dopant, such as but not limited to phosphorus, to a sheet resistance of around 4 Ohms/square. Doping of the first poly layer 230 can be performed during deposition or by a subsequent implantation process. In this case, the second poly layer 260 forms the second region 260 as shown in FIG. 2. Forming the gate finger elements 262a, 262b, 262c, 262d directly on the isolation regions 250a, 250b, 250c, 250d increases capacitive coupling to the LDD source/drain 241, 242, which enhances the RESURF effect. In one embodiment, the second poly layer 260 is formed with a thickness of around 500-850 Angstroms. In one embodiment, each isolation region 250a, 250b, 250c, 250d has at least one overlying gate finger element 262a, 262b, 262c, 262d as shown in FIG. 11A.

Figure 11B:
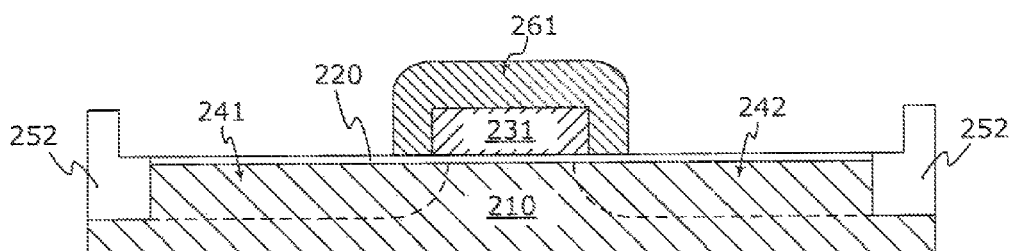
Figure 11C:
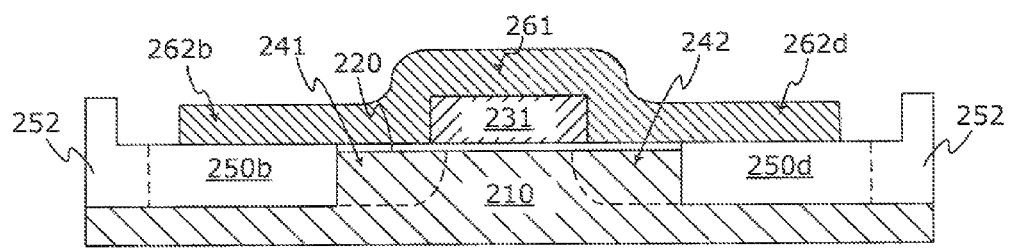

FIGS. 11B and 11C shows the center portion 261 formed directly onto the top surface and sidewalls of the patterned first poly layer 231. In other words, the center portion 261 encapsulates the patterned first poly layer 231. FIG. 11C also shows two of the gate finger elements 262b, 262d formed directly on the isolations regions 250b, 250d. In one embodiment, the bottom surface of the finger elements 262b, 262d is substantially coplanar with the bottom surface of the patterned first poly layer 231. Furthermore, the top surface of the gate finger elements 262b, 262d is lower than the top surface of the center portion 261. In one embodiment, the gate finger elements 262a, 262b, 262c, 262d have substantially uniform thickness as shown in FIG. 11C.

Figure 13:
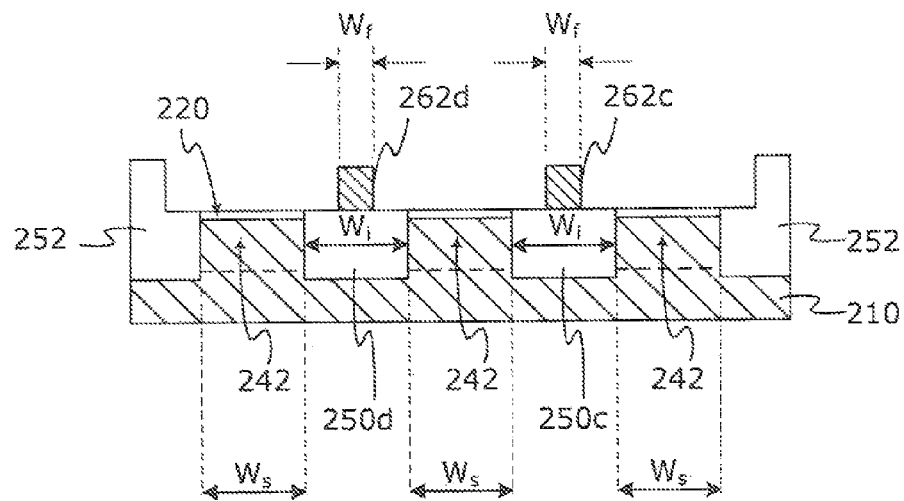
FIG. 13 is a cross-sectional view of the semiconductor device shown in FIG. 11A.

In an embodiment of the present invention, the gate finger elements 262a, 262b, 262c, 262d have substantially uniform width (Wf) as shown in FIG. 11A. In one embodiment, the gate finger elements 262a, 262b, 262c, 262d extends from the center portion 261 and are disposed centrally on the isolation regions 250a, 250b, 250c, 250d. In one embodiment, the gate finger elements 262a, 262b, 262c, 262d have a smaller width (Wf) than the width (Wi) of the isolation regions 250a, 250b, 250c, 250d as shown in FIG. 13. In one embodiment, the width (Wf) is around 0.05 um-1 um, and the width (Wi) is around 0.05 um-1 um. In a specific embodiment, the width (Wf) is around 0.20 um and the width (Wi) is around 0.25 um. In one embodiment, the width (Wf) to width (Wi) ratio (i.e.

Wf/Wi ratio) has a range of about 0.1-1.0. In a specific embodiment, the Wf/Wi ratio is around 0.8.

In one embodiment, the width (Ws) of the LDD drain 242 (or drain extension region 216) is around 0.05 um to 1 μm. In a specific embodiment, the width (Ws) is around 0.10 um. In one embodiment the extension region/isolation region width ratio (Ws/Wi) has a range of about 0.1-1.5. In, a specific embodiment, the Ws/Wi ratio is around 0.5. The Ws/Wi width ratio can be adjusted to achieve the optimal breakdown voltage for the semiconductor device. Hence, the RESURF concept provides an effective means to tune the breakdown voltage of the semiconductor device.

As mentioned above in FIGS. 4A-4C, the first poly layer 280 can be used to form the floating gate of adjacent memory cell transistors (not shown) in the Same FLASH memory fabrication process. Here, the second poly layer 260 can be used to form the control gate over the floating gate of these memory cell transistors. In FIGS. 11B and 11C, the second poly layer 260 (i.e. second region 260) is formed directly on the patterned first poly layer 231 (i.e. first region 231) without any IPD layer so that the device functions a FET and not as a memory cell transistor. The second poly layer 260 and the patterned first poly layer 231 forms a single gate electrode for the device. This completes the fabrication of the semiconductor device shown in FIG. 2. For clarity purposes, the dielectric layer no is not shown in FIG. 2.

Figure 14:
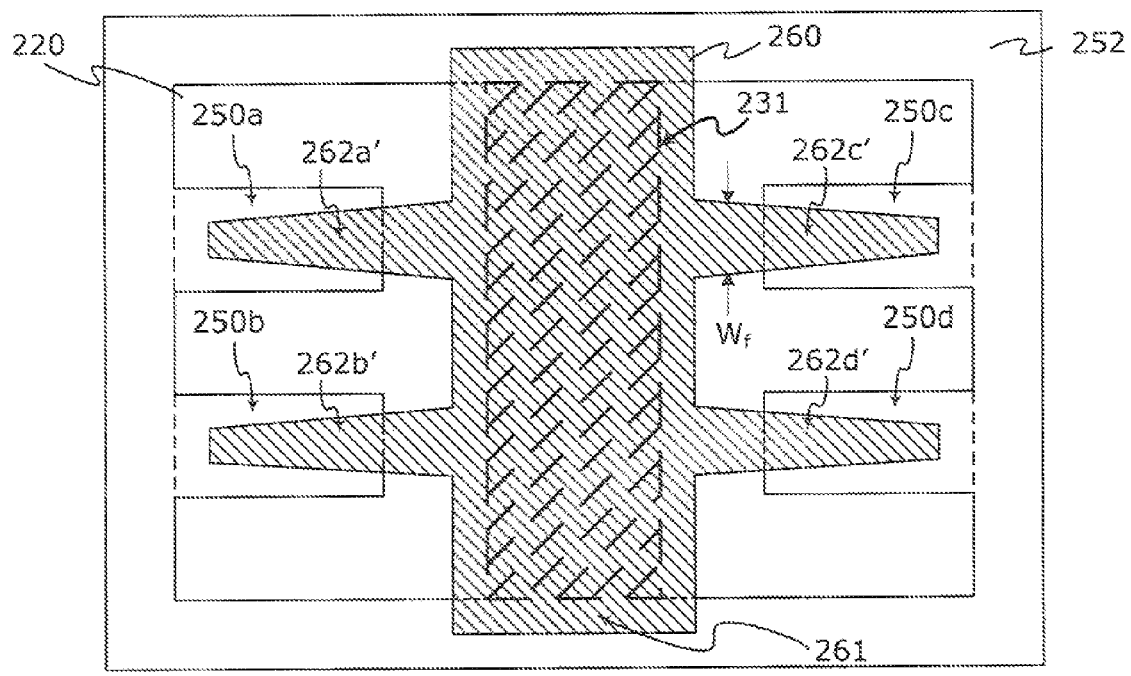
FIG. 14 is a top plan view of the semiconductor device in accordance with another embodiment of the present invention.

In an alternative embodiment, the gate finger elements 262a', 262b', 262c', 262d' each have a tapered or graded profile as shown in FIG. 14. With the tapered profile, the gate finger element 262a', 262b', 262c', 262d' have a decreasing or smaller width (Wf) as they extend away from the center portion 261.

Figure 12A:
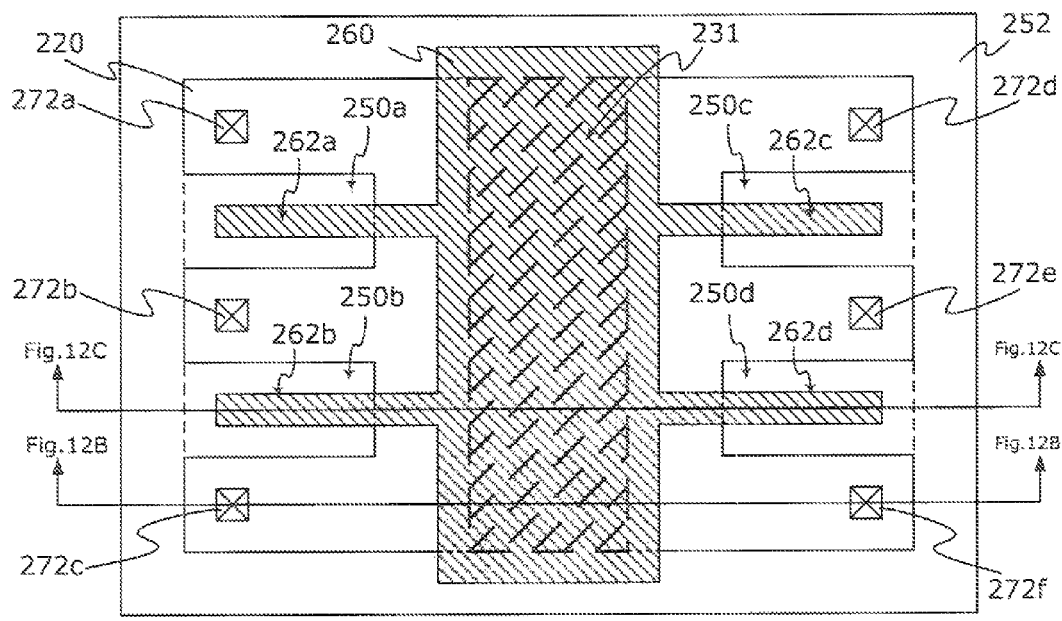
Figure 12B:
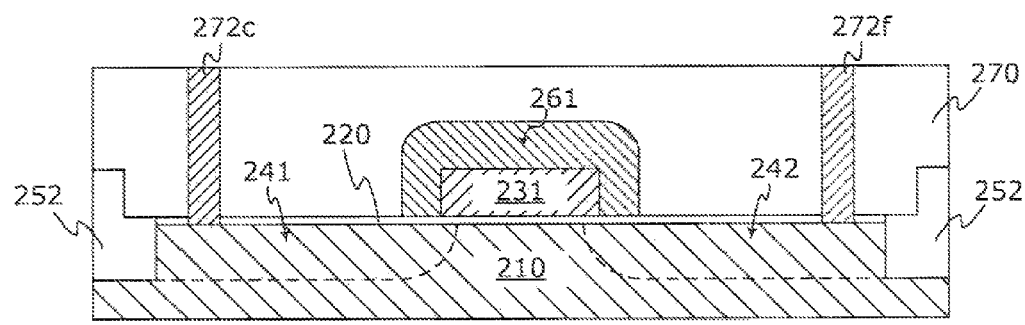
Figure 12C:
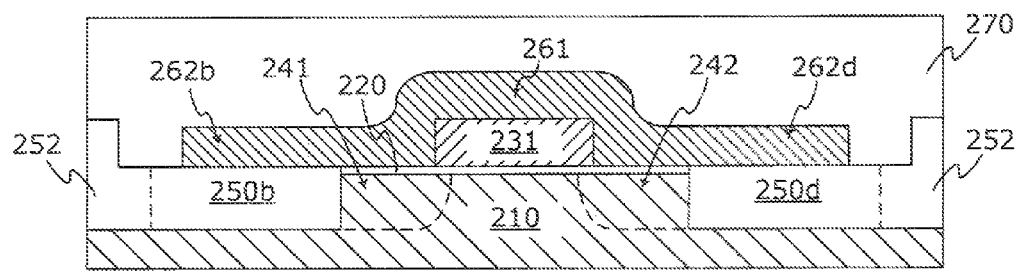

In an embodiment of the present invention, source and drain contacts are formed at the source and drain regions. In one embodiment, fabrication of the source and drain contacts begins by depositing a dielectric layer 270 over the entire substrate as shown in FIGS. 12B and 12C. In one embodiment, the dielectric layer 270 is an interlevel dielectric (ILD) layer. Contact holes or openings are then etched into the dielectric layer 270 to expose certain portions of the source/drain regions before depositing a metal layer over the contact holes to form the source/drain contacts 272a, 272b, 272C, 272d, 272e, 272f. In one embodiment, each of the source/drain contacts 272a, 272b, 272c, 272d, 272e, 272f are formed about 0.5 to 1.5 um from the gate electrode. In one embodiment, source region has 3 contacts 272a, 272b, 272c as illustrated in FIG. 12A that are interconnected (not shown). Similarly, the drain region has 3 contacts 272d, 272e, 272f that are interconnected (not shown). For clarity purposes, the dielectric layer 270 is not shown in FIG. 12A.

FIGS. 15A-18A are top plan views that illustrate a method of forming the semiconductor device shown in FIG. 3. FIGS. 15B-18B and 15C-18C are various cross-sectional views corresponding to FIGS. 15A-18A. The fabrication of the semiconductor device begins by providing the substrate 410 as shown in FIGS. 15A-15D. Then, an insulating region 420 is formed on the substrate 410. In one embodiment, the insulating region 420 is formed by using a thermal oxidation method or a local oxidation of silicon (LOCOS) process. In one embodiment, thermal oxidation is performed on selected portions of the substrate 410 so as to grow the gate oxide region 421, and grow the isolation regions 422a, 422b, 422c, 422d, 422e, 422f at the same time. In one embodiment, after thermal oxidation is completed, a polishing/planarization process is performed on the insulating region 420 to achieve a substantially planar top surface thereon as shown in FIGS. 15B, 15C, and 15D.

Figure 15A:
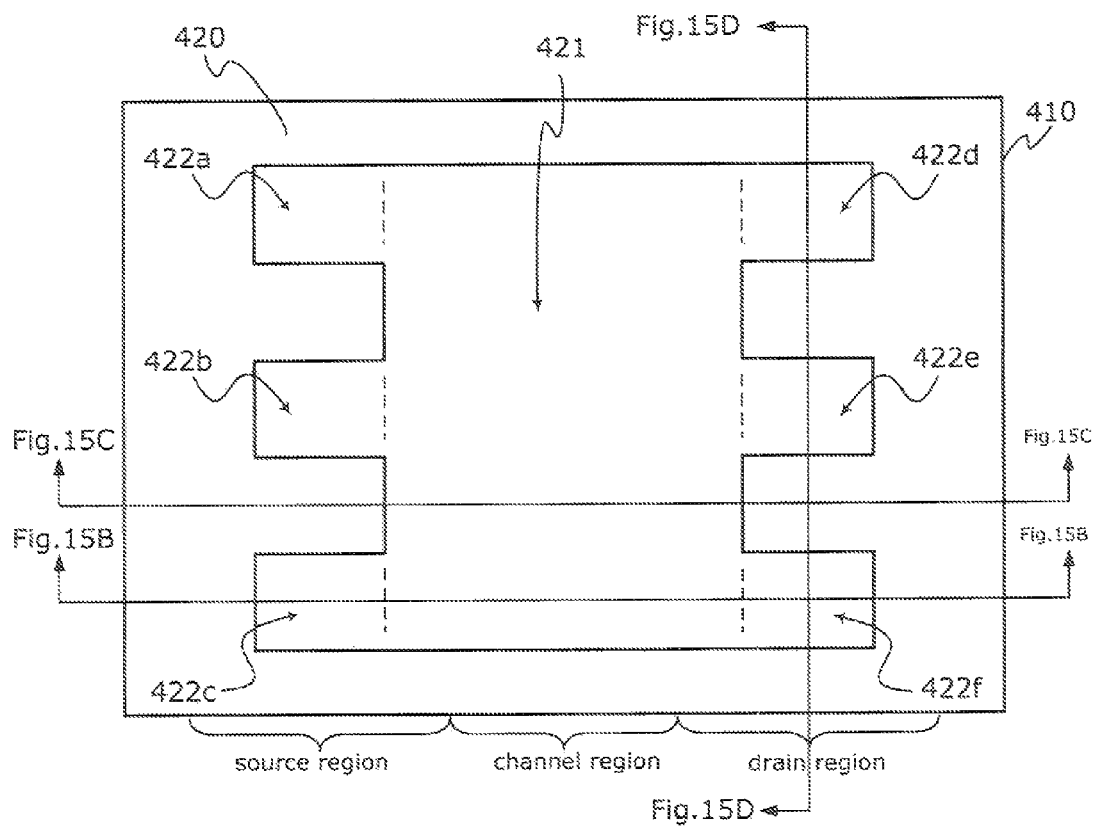
Figure 15B:
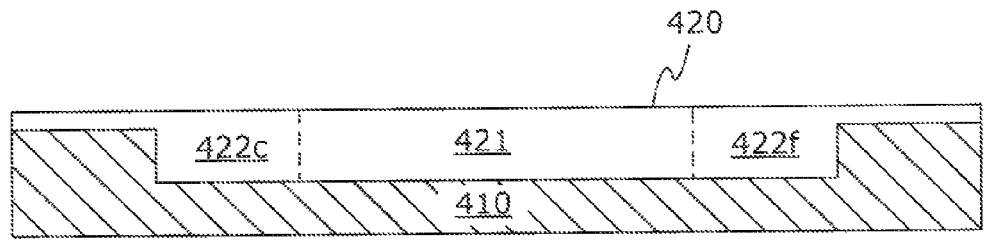
Figure 15C:
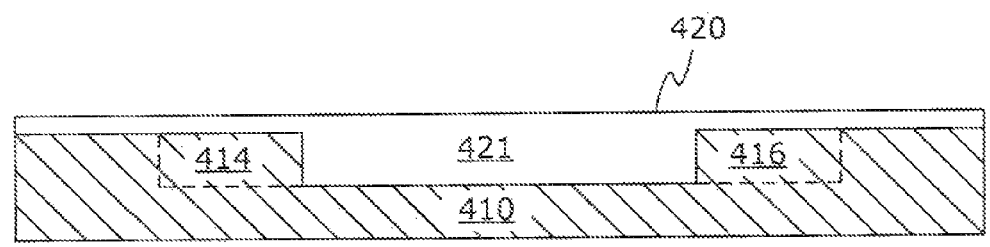
Figure 15D:
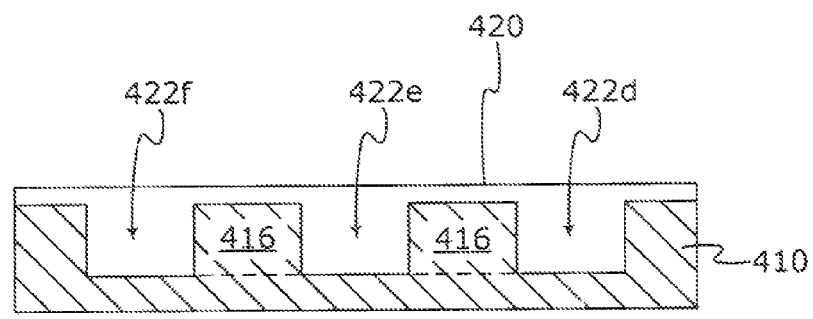

In one embodiment, isolation regions 422a, 422b, 422c are formed in the source region as shown in FIG. 15A. The isolation regions 422a, 422b, 422c interleave the source extension regions 414, which refers to the portions of the substrate 410 between the isolation regions 422a, 422b, 422c. For example, FIG. 15C shows a source extension region 414. Furthermore, isolation regions 422d, 429e, 422f are formed in the drain region as shown in FIGS. 15A and 15D. The isolation regions 422d, 422e, 422f interleave the drain extension regions 416, which refers to the portions of the substrate 410 between the isolation regions 422d, 422e, 422f as shown in FIG. 15D.

Figure 16A:
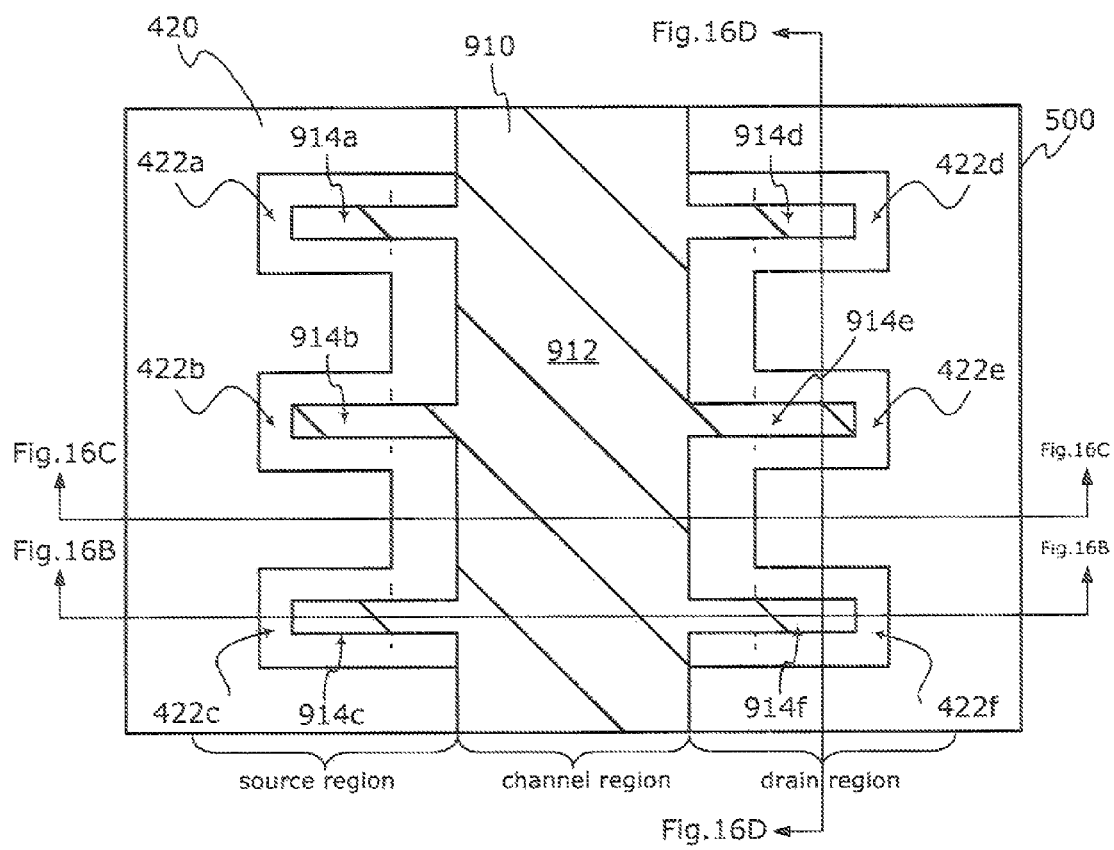

Next, a first poly layer is formed over the insulating region 420; the first poly layer having a plurality of gate finger elements extended over the plurality of isolation regions 422a, 422b, 422c, 422d, 422e, 477f. In one embodiment, the fabrication of the first poly layer begins by depositing a poly film (not shown) over the entire insulating region 420. Then, the poly film is patterned by depositing a mask 910 on the poly film, and etching in alignment with the mask 910 to define the first poly layer. In one embodiment, the mask 910, as shown in FIG. 16A, comprises a center portion 912 formed over a desired channel region. The mask 910 further comprise a plurality of mask finger elements 914a, 914b, 914c, 914d, 914e, 914f extending outwardly from opposite sides of the center portion 912. In one embodiment, the mask finger elements 1914a, 914b, 914c are formed over the isolation regions 422a, 422b, 422c of the source region, and the mask finger elements 914d, 914e, 914f are formed over, the isolation regions 422d, 422e, 422f of the drain region.

Figure 16B:
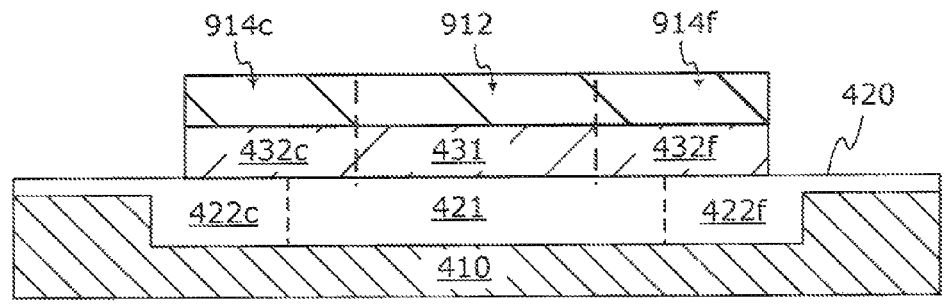
Figure 16C:
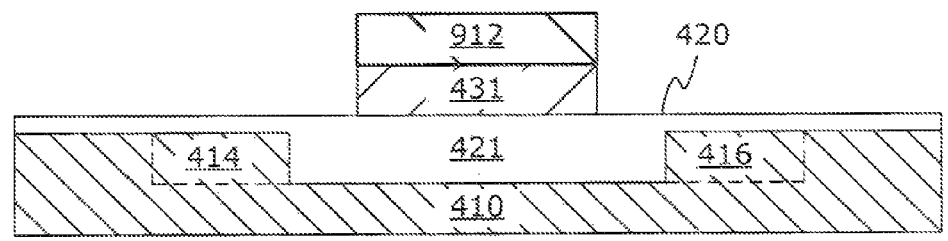
Figure 16D:
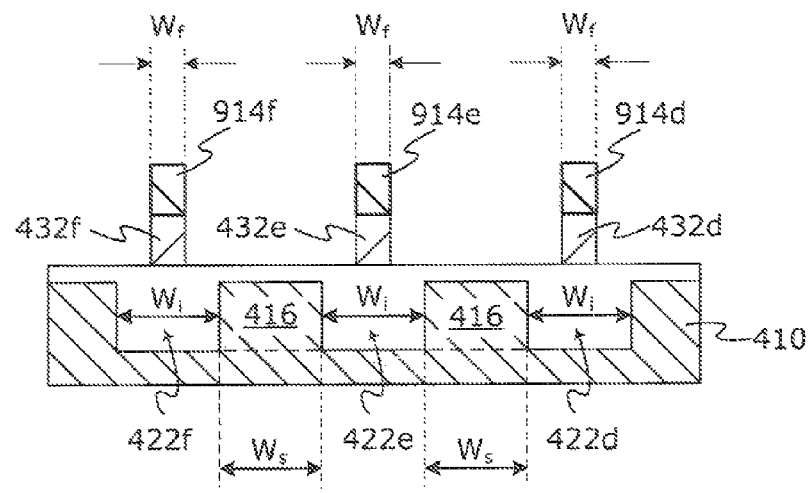
Figure 17A:
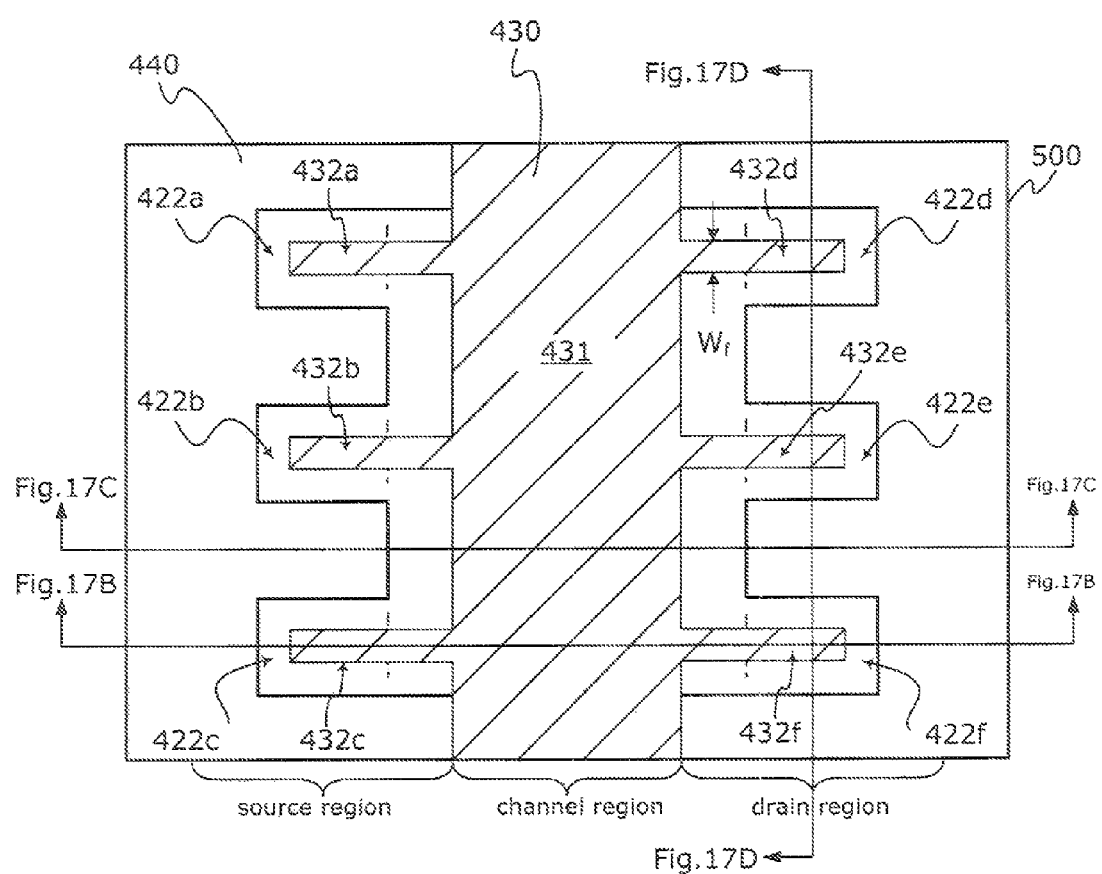
Figure 17B:
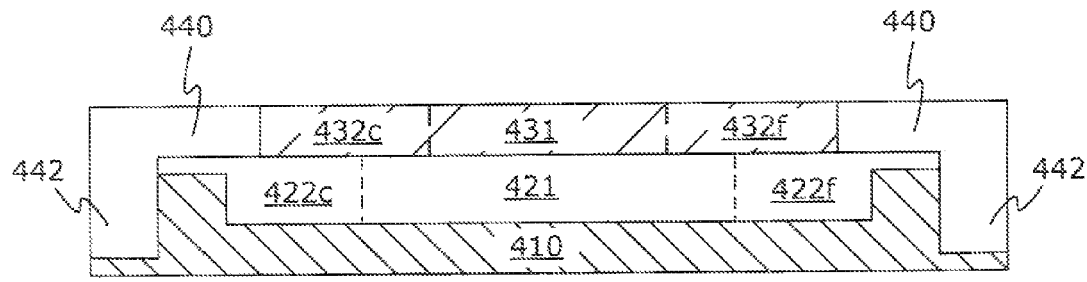

The etching performed in alignment with the mask 910 defines the plurality of gate finger elements beneath the mask finger elements 914a, 914b, 914c, 914d, 914e, 914f. FIG. 16B shows the gate finger elements 432c, 432f formed under mask finger elements 914c, 914f. Furthermore, FIG. 16D shows the gate finger elements 432d, 432e, 432f formed under mask finger elements 914d, 914e, 914f. The etching further defines a center portion 431 of the first poly layer 430 beneath the center portion 912 of the mask 910 as shown in FIGS. 16B and 16C. FIG. 17A shows a top plan view of the first poly layer 430 after the mask 910 is removed, which illustrate gate finger elements 432a, 432b, 432c, 432d, 432e, 432f extending outwardly from both sides of a center portion 431 of the first poly layer 430. The gate finger elements 432a, 432b, 432c, 432d, 432e, 432f are formed over the isolation regions 422a, 422b, 422c, 477d, 422e, 422f. In this case, the first poly layer 430 refers to the first region 430 as shown in FIG. 3.

In the case of a FLASH memory fabrication process, the first poly layer 430 can be used to form the floating, gate of adjacent memory cell transistors (not shown) on the same substrate. In one embodiment, the first poly layer 430 is deposited with a thickness of around 500-850 Angstroms.

In one embodiment, the gate finger elements 432a, 432b, 432c, 432d, 432e, 432f have substantially uniform thickness. For example, FIG. 16B illustrates the gate fingers elements 432c, 432f having substantially uniform thickness of around 500-800 Angstroms as the center portion 431.

In an embodiment of the present invention, the gate finger elements 432a, 432b, 432c, 432d, 432e, 432f have substantially uniform width (Wf) as shown in FIG. 17A. In one embodiment, the gate finger elements 432a, 432b, 432c, 432d, 432e, 432f have a smaller width than the isolation regions 422a, 422b, 422c, 422d, 422e, 422f. FIG. 16D shows the gate fingers elements 432d, 432e, 432f having a smaller width (Wf) than the width (Wi) of the isolation regions 422d, 422e, 422f. In one embodiment, the width (Wf) is around 0.05 um-1 um, and the width (Wi) is around 0.05 um-1 um. In a specific embodiment, the width (Wf) is around 0.20 um and the width (Wi) is around 0.25 um. In one embodiment, the width (Wf) to width (Wi) ratio (i.e. Wf/Wi ratio) has a range of about 0.1-1.0. In a specific embodiment, the Wf/Wi ratio is around 0.8°.

In one embodiment, the width (Ws) of the extension regions 242 is around 0.05 um to 1 um. In a specific embodiment, the width (Ws) is around 010 um In one embodiment the extension region/isolation region width ratio (Ws/Wi) has a range of about 0.1-1.5. In a specific embodiment, the Ws/Wi ratio is around 0.5. The Ws/Wi width ratio can be adjusted to achieve the optimal breakdown voltage for the semiconductor device.

After etching is completed, a LDD implantation can be performed on the substrate 410, including the source and drain extension regions 414, 416, to form LDD regions in the source and drain regions of the substrate 210. In one embodiment, the LDD implantation is performed using the same mask 910. In another embodiment, the LDD implantation is performed subsequently using another mask with openings that expose the source and drain regions. The LDD implantation uses common techniques such as ion implantation to implant desired concentrations of boron, phosphorus or arsenic into the substrate 410.

Figure 17C:
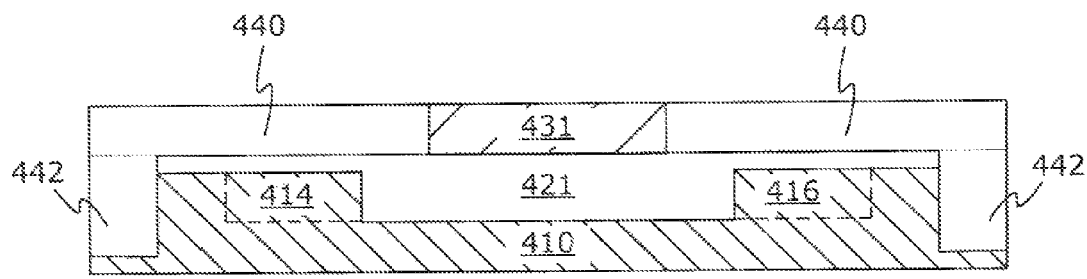
Figure 17D:
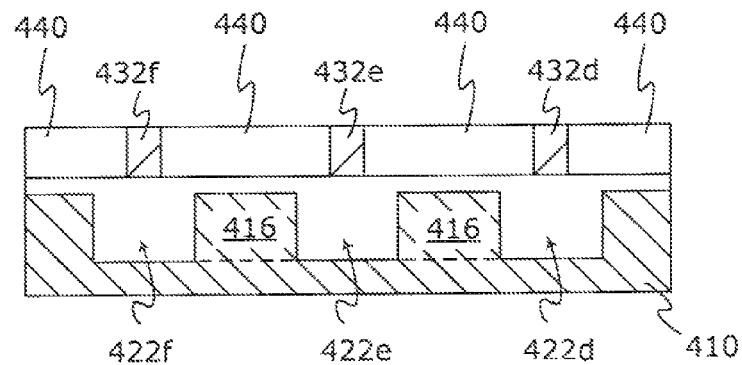

Next, an insulating layer 440 is formed over the first poly layer 430. In an embodiment of the present invention, the insulating layer 440 is deposited onto the first poly layer 430 after the mask 910 is removed as shown in FIGS. 17A-17D. Then, the insulating layer 440 is planarized or polished so that its top surface is substantially coplanar to the top surface of the first poly layer 430. FIG. 17C shows the insulating layer 440 formed onto the sidewalls of the center portion 431. FIG. 17D shows the insulating layer 440 formed onto the sidewalls of the gate finger elements 432d, 432e, 432f. The insulating layer 440 is made from any well known insulative materials such as but not limited to silicon oxides.

In one embodiment, STI regions 442 can be formed during the process of fabricating the insulating layer 440. For example, trenches are formed beside the source/drain regions and then filled up during the deposition of the insulating layer 440.

Next, an interpoly dielectric (IPD) is deposited. The interpoly dielectric is removed from the periphery devices before the deposition of the second poly layer.

Figure 18A:
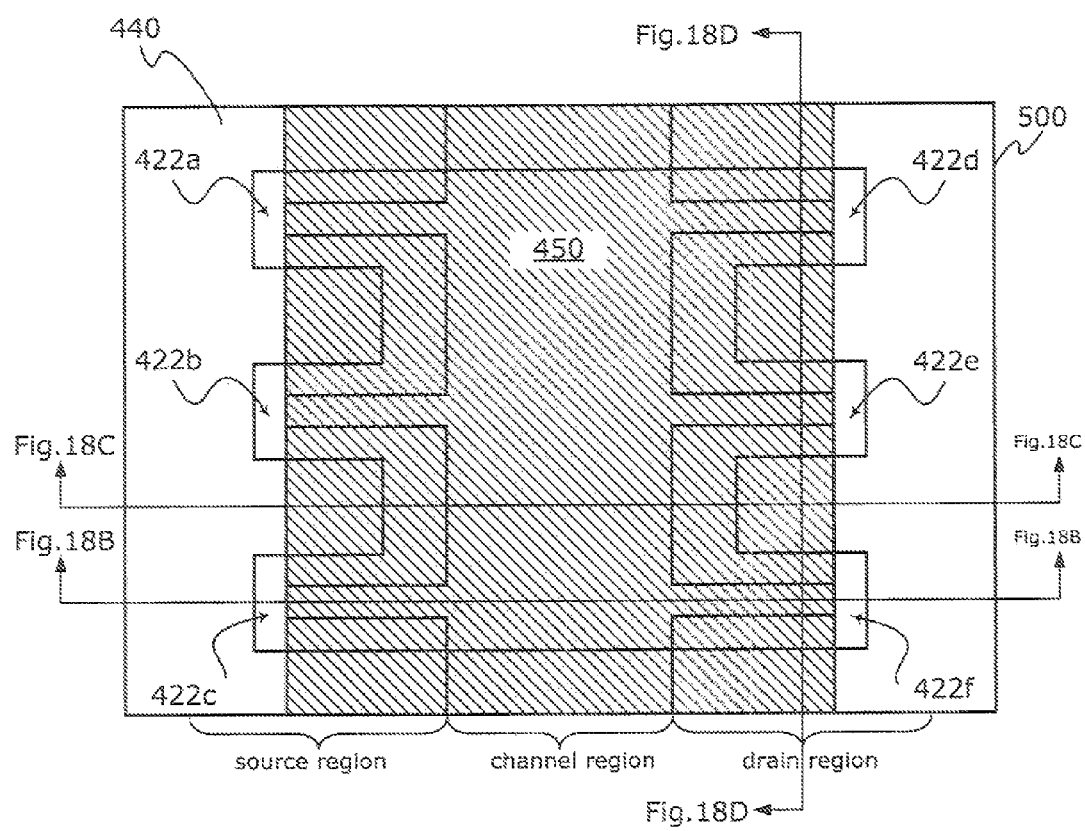

Next, a second poly layer 450 is formed over the first poly layer 430 as shown in FIG. 18A. In an embodiment of the present invention, fabrication of the second poly layer 450 begins by blanket depositing a poly film (not shown) directly on the patterned first poly layer 430. Then, the poly film is patterned using well known photolithography and etching techniques to define the second poly layer 450. In one embodiment, the second poly layer 260 is formed with a thickness of around 500-850 Angstroms. In this case, the second poly layer 450 refers to the second region 450 show in FIG. 3.

Figure 18B:
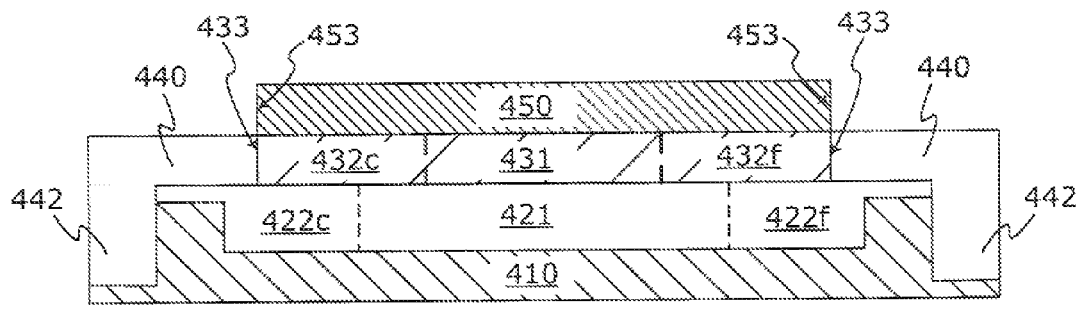

In one embodiment, the second poly layer 430 is patterned so that its sidewalls are aligned to the tip of the gate finger elements 432a, 432b, 432c, 432d, 432e, 432f as shown in FIG. 18A. Furthermore, FIG. 18B shows the second poly layer 450 having sidewalls 453 aligned to the tip surfaces 433 of the gate finger elements 432c, 432f. In an alternative embodiment, the second poly layer 430 can extend past the tip surfaces 433 of the gate finger elements 432a, 432b, 432c, 432d, 432e, 432f.

Figure 18C:
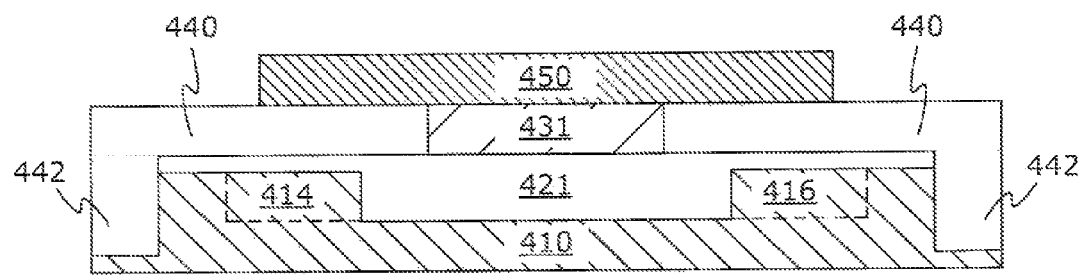
Figure 18D:
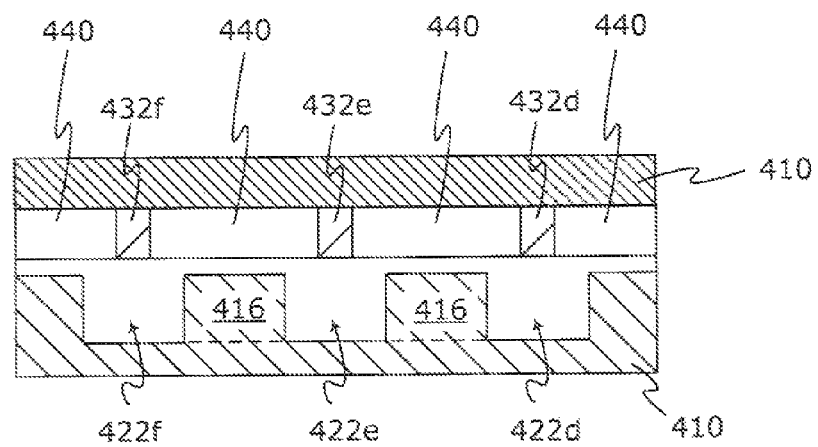

As mentioned above in FIGS. 16A-16D, the first poly layer 430 can be used to form the floating gate of adjacent memory cell transistors (not shown) in a FLASH memory fabrication process. Here, the second poly layer 450 can be used to form the control gate over the floating gate of those memory cell transistors. In FIGS. 18B-18D, the second poly layer 450 (i.e. second region 450) is formed directly on the first poly layer 231 (i.e. first region 450) without any IPD layer so that the device functions a FET and not as a memory cell transistor. In particular, the second poly layer 430 is formed directly on the center portion 431 and the plurality of gate finger elements 432a, 432b, 432c, 432d, 432e, 432f as shown in FIGS. 18B-18D. The first poly layer 430 and the second poly layer 450 form a single gate electrode. This completes the fabrication of the semiconductor device shown in FIG. 3.

Figure 19A:
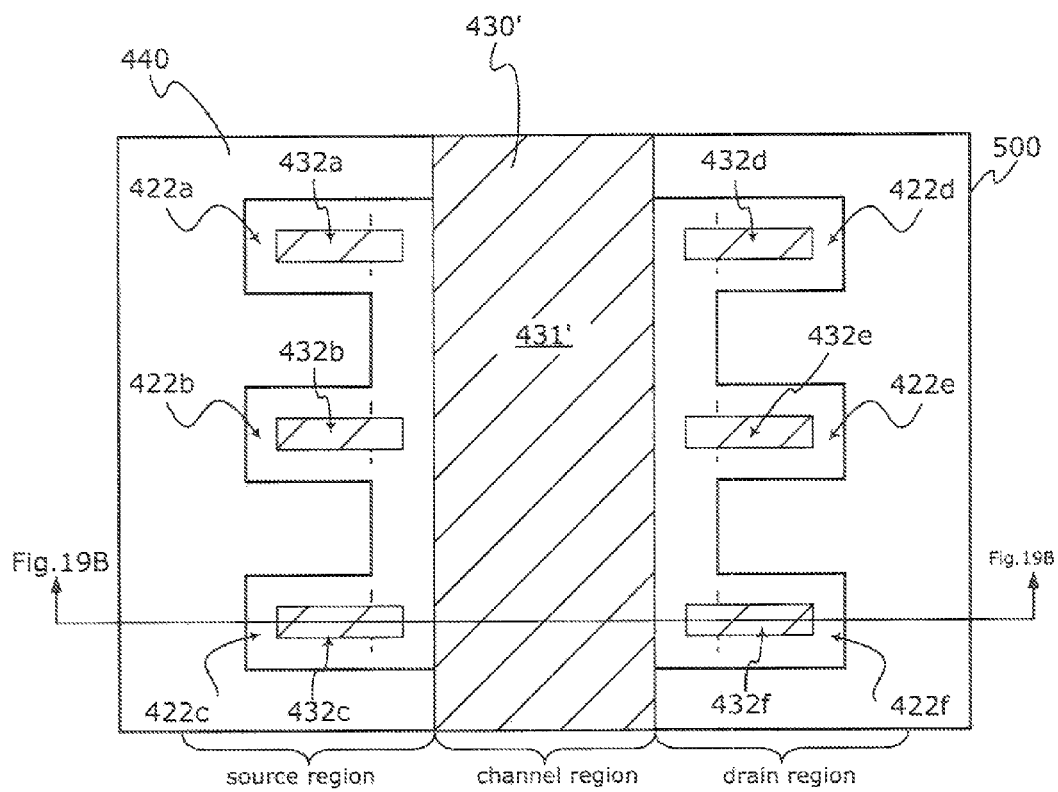

FIG. 17A illustrates the first poly layer 430 having the plurality of gate finger elements 432a, 432b, 432c, 432d, 432e, 432f extended from the center portion 431. In an alternative embodiment, the plurality of gate finger elements 432a', 432b', 432c', 432d', 432e', 432f' are separated from the center portion 431' as shown in FIG. 19A. In other words, the gate finger elements 432a', 432b', 432c', 432d', 432e', 432f' are not continuous with the center portion 431'.

In one embodiment, the alternative first poly layer 430' can be fabricated by blanket depositing a poly film (not shown) on the insulating region 420 shown in FIGS. 15A-15D. Then, well known photolithography and etching techniques can be performed, on the poly film to define the center portion 431' and the finger elements 432a', 432b', 432c', 432d', 432e', 432f'.

Figure 19B:
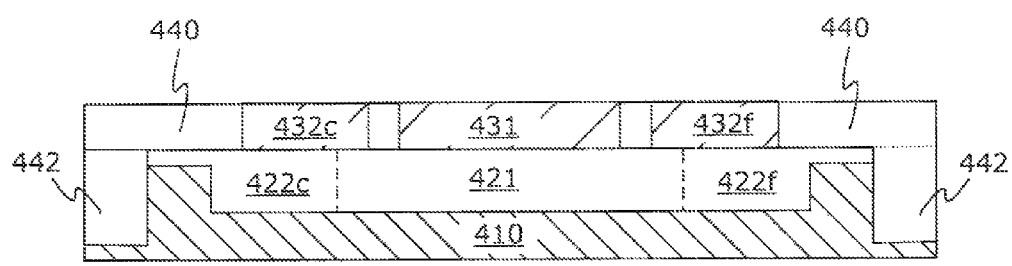

After forming the first poly layer 430', the insulating layer 440 as described in FIGS. 17A-17D is formed onto the first poly layer 430'. FIG. 19A shows gate finger elements 432a', 432b', 432c', 432d', 432e', 432f' surrounded by the insulating layer 440. FIG. 19B shows the insulating layer 440 formed onto the sidewalls of the center portion 431' as well as on the sidewalls of the gate finger elements 432e', 432f'.

Figure 20A:
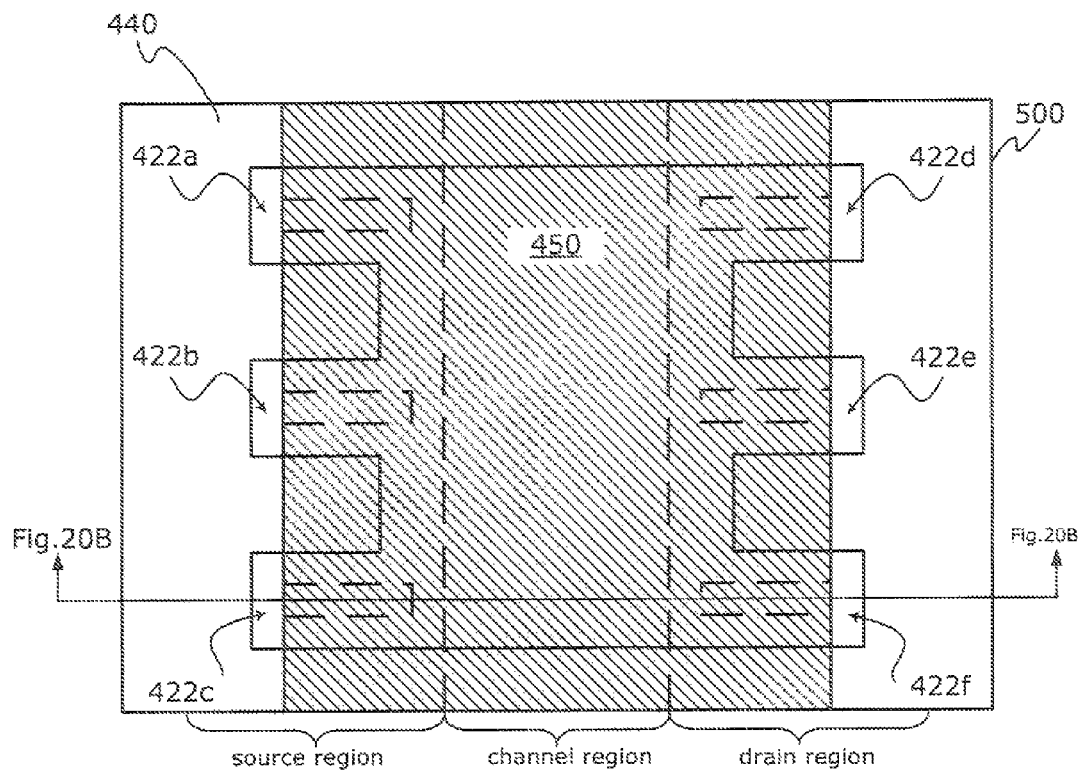
Figure 20B:
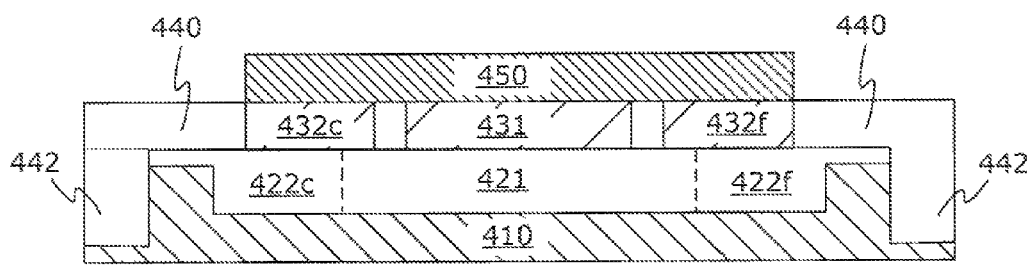

Next, in FIGS. 20A and 20B, the second poly layer 450 is formed onto the first poly layer 430'. The method of forming the second poly layer 450 is similar to the FIGS. 18A-18D and hence will not be discussed here.

Several embodiments of the invention have thus been described. However, those ordinarily skilled in the art will recognize that the invention is not limited to the embodiments described, but can be practiced with modification and alteration within the spirit and scope of the appended claims that follow.

I claim:

1. A method of forming a semiconductor device comprising:
   depositing a dielectric layer over a substrate;
   depositing a first poly layer over the dielectric layer;
   forming a plurality of isolation regions in a source region or a drain region of the substrate;
   etching the first poly layer to form a patterned first poly layer over a channel region of the substrate; and
   forming a second poly layer over the patterned first poly layer, the second poly layer having finger elements extended over the plurality of isolation regions.

2. The method of claim 1, wherein forming the plurality of isolation regions comprises:
   forming a plurality of trenches in the source region or drain region of the substrate; and
   depositing an oxide layer into each of the plurality of trenches so as to form the plurality of isolation regions.

3. The method of claim 2, wherein forming a plurality of trenches comprises:
   depositing a first mask on the first poly layer; and
   etching portions of the substrate not covered by the first mask to form the plurality of trenches in the substrate.

4. The method of claim 2, further comprising:
polishing the plurality of isolation regions such that the top surface of each of the plurality of isolation regions is substantially coplanar with the top surface of the first poly layer.

5. The method of claim 1, wherein etching the first poly layer comprises:
forming a second hardmask over the first poly layer, the second mask having a first opening exposing the source region, and a second opening exposing the drain region;
etching portions of the first poly layer in alignment to the second mask to form a patterned first poly layer over the gate region; and
etching portions of the plurality of isolation regions so that the top surface of each of the plurality of isolation regions is substantially coplanar with the top surface of the dielectric layer.

6. The method of claim 5, further comprising:
forming lightly doped diffusion (LDD) regions in source and drain regions of substrate.

7. The method of claim 1, wherein forming the second poly layer over the patterned first poly layer comprises:
depositing a poly film directly on the patterned first poly layer;
and patterning the poly film to form the second poly layer with finger elements extended over the plurality of isolation regions.

\* \* \* \* \*

UNITED STATES PATENT AND TRADEMARK OFFICE
CERTIFICATE OF CORRECTION

PATENT NO.         : 8,236,640 B2                                          Page 1 of 2
APPLICATION NO.    : 12/642604
DATED              : August 7, 2012
INVENTOR(S)        : Smith It is certified that error appears in the above-identified patent and that said Letters Patent is hereby corrected as shown below:

In the Specification

In column 1, at line 12 delete, "devices an" insert -- devices and --.

In column 2, at line 39 delete, "haying" insert -- having --.

In column 2, at line 41 delete, "Agate" insert -- A gate --.

In column 2, at line 55 delete, "(Site)," insert -- (SiGe), --.

In column 3, at line 4 delete, "Oxide" insert -- oxide --.

In column 3, at line 7 delete, "250e" insert -- 250c --.

In column 3, at line 17 delete, "Materials" insert -- materials --.

In column 4, at line 53 delete, "Over" insert -- over --.

In column 4, at line 63 delete, "With" insert -- with --.

In column 5, at line 34 delete, "Subsequently" insert -- subsequently --.

In column 5, at line 56 delete, "FIG. 50" insert -- FIG. 5C --.

In column 6, at line 26 delete, "embodiment. Of the" insert -- embodiment of the --.

In column 6, at line 37 delete, "FIGS. 78" insert -- FIGS. 7B --.

In column 7, at line 37 delete, "2504" insert -- 250d --.

In column 7, at line 61 delete, "Abe" insert -- be --.

In column 9, at line 4 delete, "1μm" insert -- 1 um --.

Signed and Sealed this
Twenty-ninth Day of April, 2014

Michelle K. Lee
*Deputy Director of the United States Patent and Trademark Office*

CERTIFICATE OF CORRECTION (continued)
U.S. Pat. No. 8,236,640 B2

In column 9, at line 14 delete, "280" insert -- 230 --.

In column 9, at line 15 delete, "Same" insert -- same --.

In column 9, at line 42 delete, "272C," insert -- 272c, --.

In column 10, at line 7 delete, "429e," insert -- 422e, --.

In column 10, at line 16 delete, "477f." insert -- 422f. --.

In column 10, at line 27 delete, "1914a," insert -- 914a, --.

In column 10, at line 46 delete, "477d," insert -- 422d, --.

In column 11, at line 5 delete, "0.8°." insert -- 0.8. --.

In column 11, at line 8 delete, "010 um" insert -- 0.10 um --.